United States Patent
Fiorentino et al.

(10) Patent No.: US 10,192,857 B2
(45) Date of Patent: Jan. 29, 2019

(54) DIRECT BANDGAP SEMICONDUCTOR BONDED TO SILICON PHOTONICS

(71) Applicant: HEWLETT PACKARD ENTERPRISE DEVELOPMENT LP, Houston, TX (US)

(72) Inventors: Marco Fiorentino, Mountain View, CA (US); Di Liang, Santa Barbara, CA (US); Geza Kurczveil, Palo Alto, CA (US); Raymond G Beausoleil, Seattle, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/338,699

(22) Filed: Oct. 31, 2016

(65) Prior Publication Data
US 2018/0122785 A1    May 3, 2018

(51) Int. Cl.
| G02B 6/13 | (2006.01) |
| H01L 25/16 | (2006.01) |
| H01L 23/00 | (2006.01) |
| H01L 25/00 | (2006.01) |
| G02B 6/12 | (2006.01) |

(52) U.S. Cl.
CPC ........ *H01L 25/167* (2013.01); *G02B 6/12002* (2013.01); *H01L 24/80* (2013.01); *H01L 24/94* (2013.01); *H01L 25/50* (2013.01); *G02B 2006/12147* (2013.01); *H01L 2224/80894* (2013.01)

(58) Field of Classification Search
USPC .......................................................... 385/14
See application file for complete search history.

(56) References Cited

U.S. PATENT DOCUMENTS

| 8,774,582 | B1 | 7/2014 | Jacob-Mitos | |
| 8,842,945 | B2* | 9/2014 | Nguyen | G02B 6/12004 385/1 |
| 8,901,576 | B2* | 12/2014 | Doany | H01L 21/76251 257/88 |
| 9,316,785 | B2 | 4/2016 | Krasulick | |
| 2012/0057816 | A1* | 3/2012 | Krasulick | G02B 6/12 385/14 |
| 2014/0038392 | A1* | 2/2014 | Yonehara | H01L 21/304 438/463 |

FOREIGN PATENT DOCUMENTS

WO    WO-2016011002 A1    1/2016

\* cited by examiner

*Primary Examiner* — Eric Wong
(74) *Attorney, Agent, or Firm* — Nolte Intellectual Property Law Group

(57) ABSTRACT

According to an example of the present disclosure a direct bandgap (DBG) semiconductor structure is bonded to an assembly comprising a silicon photonics (SiP) wafer and a complementary metal-oxide-semiconductor (CMOS) wafer. The SiP wafer includes photonics circuitry and the CMOS wafer includes electronic circuitry. The direct bandgap (DBG) semiconductor structure is optically coupled to the photonics circuitry.

20 Claims, 18 Drawing Sheets

REMOVE SiP SUBSTRATE

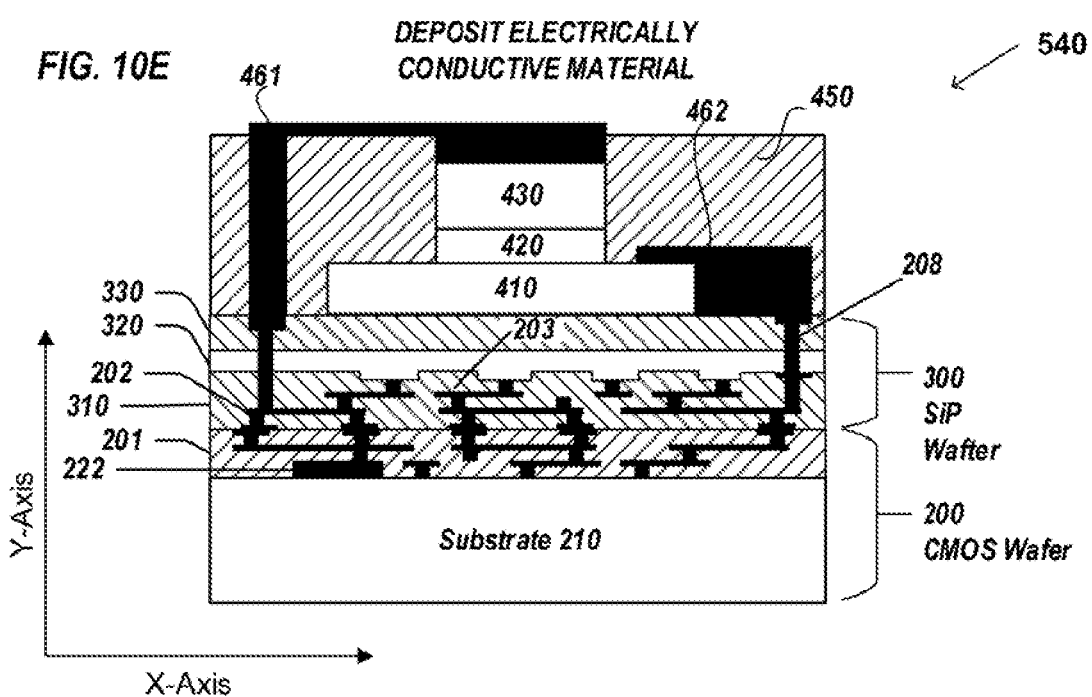

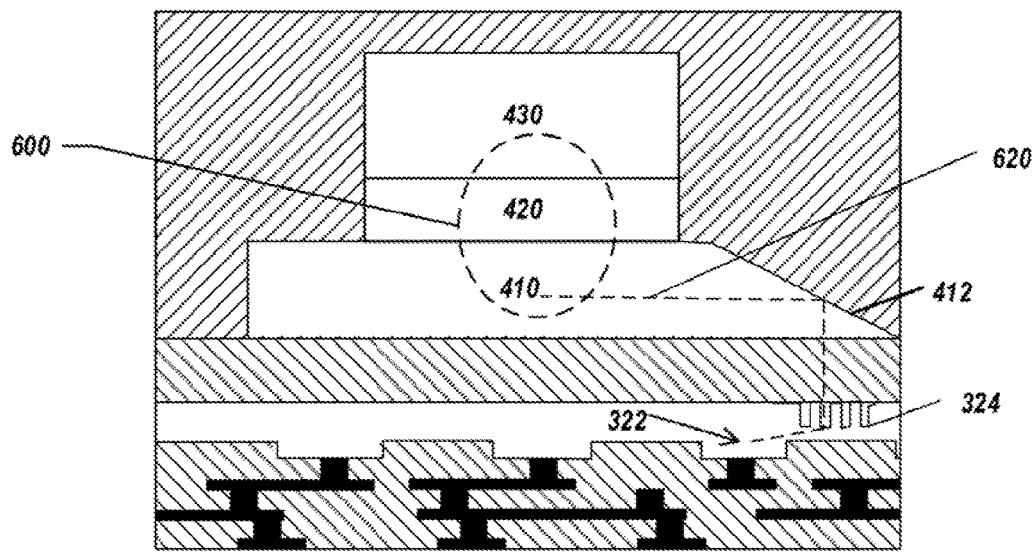
Fig. 15  COUPLING BY ANGLED FACET AND GRATING
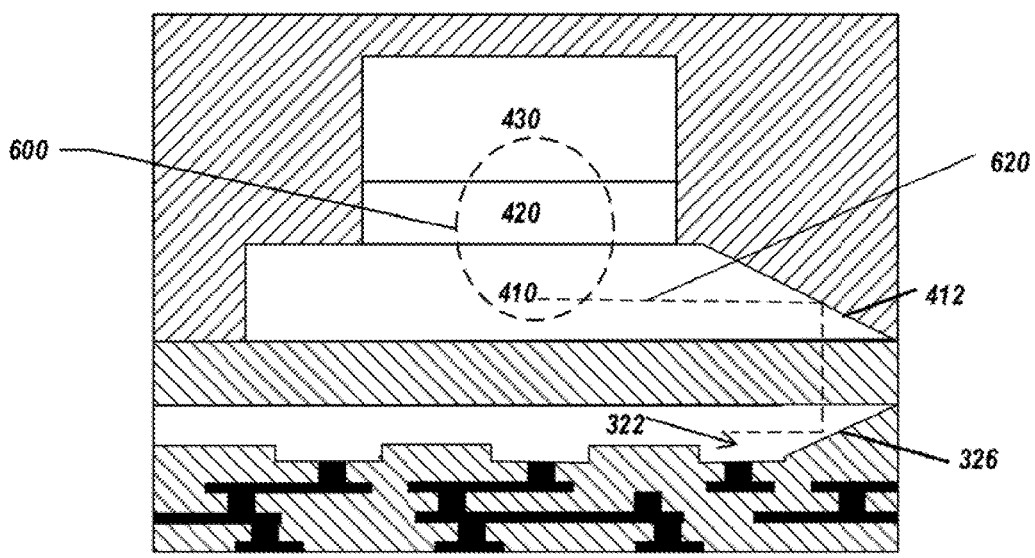
Fig. 16  COUPLING BY ANGLED FACETS

DIRECT BANDGAP SEMICONDUCTOR BONDED TO SILICON PHOTONICS

BACKGROUND

Photonics is the field of technology relating to the generation, transmission, reception and manipulation of light. Photonic devices include for example waveguides, splitters, combiners, wavelength-division multiplexing (WDM) structures, mirrors, gratings, lasers, photodetectors, optical amplifiers, optical modulators, optical filters, optical resonators etc. Silicon photonics (SiP) relates to photonic devices which are based on silicon and has the potential to provide high quality, low cost photonic devices built using silicon chip technologies.

BRIEF DESCRIPTION OF THE DRAWINGS

Examples of the disclosure will now be described, by way of non-limiting example, with reference to the accompanying drawings, in which:

FIGS. 10A to 10E are cross sectional diagrams showing examples of various stages of manufacture of an assembly according to the method of FIG. 9;

FIGS. 13 to 16 are cross sectional diagrams showing examples of optical coupling according to the present disclosure;

DETAILED DESCRIPTION

Figure 1:
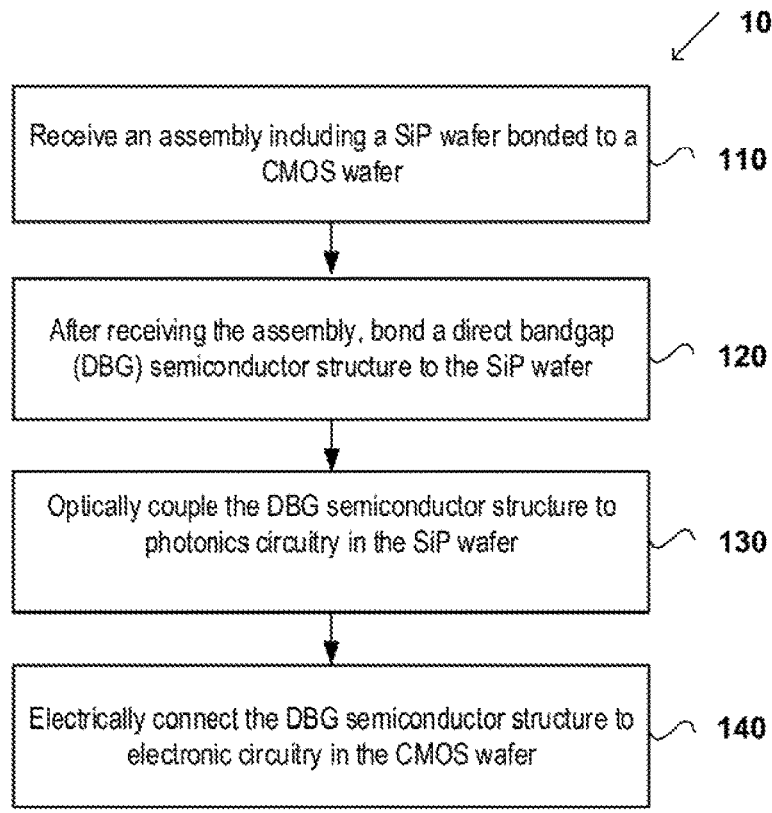
FIG. 1 is a flowchart showing an example method according to the present disclosure.

For simplicity and illustrative purposes, the present disclosure is described by referring mainly to examples thereof. As used herein, the terms "includes" means includes but not limited to, the term "including" means including but not limited to. The term "comprises" means includes but not limited to, the term "comprising" means including but not limited to. The term "based on" means based at least in part on. The term "number" means any natural number equal to or greater than one. The terms "a" and "an" are intended to denote at least one of a particular element. The term "connected to" means "connected directly or indirectly to", the term "connects to" means "connects directly or indirectly to". Several examples and diagrams refer to layers of an assembly and their relative positions. Positioned over means positioned above and includes directly above and above with one or more layers in between. Positioned under means positioned below and includes directly below and below with one or more layers in between. It is to be understood that each layer may itself comprise one or more sub-layers.

Complementary metal oxide semiconductor (CMOS) fabrication is a well-established technology for manufacturing silicon based electronic integrated circuits. Due to many years of research such electronic ICs can now be manufactured at a large scale, at low unit cost with high reliability and with very small transistor sizes.

Silicon photonic (SiP) devices may be manufactured by processing a silicon substrate to sub-micro meter precision. Complementary metal oxide semiconductor (CMOS) fabrication lines may be used to form the SiP devices thereby leveraging existing production lines and many years of experience with CMOS fabrication techniques. However, the manufacturing environment for CMOS fabrication is very tightly specified and controlled and many substances are forbidden on a CMOS production line.

Silicon, Germanium and other CMOS compatible semiconductors have an indirect bandgap. An indirect band gap semiconductor is a semiconductor in which the maximum energy of the valence band occurs at a different value of momentum to the minimum energy of the conduction band. As such indirect bandgap semiconductors are suitable for constructing waveguides, gratings and mirrors, but are not optimum for the construction of light emitting and light detecting devices. Certain photonic devices, especially lasers, but also photodetectors and others, are best implemented using direct bandgap semiconductors. A direct bandgap (DBG) semiconductor is a semiconductor in which the maximum energy of the valence band and the minimum energy of the conduction band occur at the same value of momentum. Direct bandgap semiconductors include, but are not limited to, Group III-V semiconductors and Group II-VI semiconductors. A Group III-V semiconductor is a semiconductor including at least one element from Group III or Group V of the Periodic Table. A Group II-VI semiconductor is a semiconductor including at least one element from Group II or Group VI of the Periodic Table. Many direct bandgap semiconductors are compound semiconductors, which are semiconductors composed of two or more elements.

In general, direct bandgap semiconductor materials, such as Group III-V materials, are not allowed on a CMOS production line. Furthermore, certain materials such as gold, which are often used as electrical contacts for direct bandgap semiconductor devices, are not allowed on a CMOS production line.

Accordingly, one example of the present application proposes a method including receiving an assembly comprising a SiP wafer which has been bonded to a CMOS wafer. The SiP wafer is a wafer which includes photonic circuitry, wherein at least some of the photonic circuitry includes silicon. The CMOS wafer is a wafer which includes electronic circuitry, at least some of the circuitry including a metal-oxide-semiconductor structure. The electronic circuitry may include silicon. The method comprises bonding a direct bandgap (DBG) semiconductor structure to the SiP wafer. Because the DBG semiconductor structure is bonded to the SiP wafer after the SiP wafer has been bonded to the CMOS wafer, the bonding of the DBG semiconductor structure to the SiP wafer may be carried out on a different production line, or at the back end of the production line, so as not to contaminate the CMOS manufacturing facilities.

The DBG semiconductor structure may be optically coupled to the photonic circuitry in the SiP wafer and electrically connected to the electronic circuitry in the CMOS wafer. In one example, the DBG semiconductor structure is controlled by the electronic circuitry and generates light that is to be directed to the photonics circuitry. In another example the DBG semiconductor structure detects an optical signal received from the photonic circuitry and sends an electrical signal based on the optical signal to the electronic circuitry for processing.

FIG. 1 is a flow diagram showing a method 10 according to one example of the present disclosure.

At block 110 of method 10, an assembly 100 including a SiP wafer 300 which has already been bonded to a CMOS wafer 200 is received. The assembly 100 may for example be received by a production line, or section of a production line, which is to carry out processes such as those described in any of blocks 120-140 described below.

Figure 2:
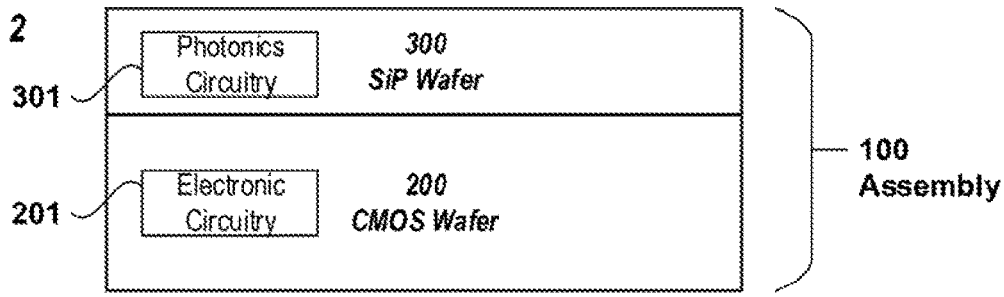
FIG. 2 is a schematic diagram showing an example assembly according to the present disclosure.

The SiP wafer 300 and CMOS wafer 200 may have been bonded together to form the assembly at an earlier stage of the manufacturing process, prior to block 110, as is described in more detail later. An example of the assembly 100 comprising the CMOS wafer 200 bonded to the SiP wafer 300 is shown in FIG. 2.

The CMOS wafer 200 comprises electronic circuitry 201. The electronic circuitry 201 includes at least one logic device, such as a transistor, logic gate, processor etc. The electronic circuitry may also include electronically conductive lines to connect logic devices of the electronic circuitry together and/or to connect the electronic circuitry with devices external to the CMOS wafer, as will be described in more detail later. The electrical circuitry may further comprise resistors, capacitors, inductors, high speed analogue circuitry etc. The electronic circuitry 201 may have been fabricated on the CMOS wafer in a previous process on another production line, or at an earlier stage of the same production line.

The SiP wafer 300 comprises photonics circuitry 301. The photonics circuitry 301 may include one or more photonic devices, such as but not limited to an waveguides, optical splitters, optical combiners, wavelength-division multiplexing (WDM) structures, mirrors, gratings, lasers, photodetectors, optical amplifiers, optical modulators, optical filters, optical resonators. In some examples the photonics circuitry includes a plurality of photonic devices at least some of which are to perform different optical functions to each other. The photonic circuitry 301 may have been fabricated on the SiP wafer in a previous process on another production line, or at an earlier stage of the same production line.

At block 120 of method 10, a direct bandgap (DBG) semiconductor structure is bonded to the SiP wafer. Any suitable bonding method may be used including, but no limited to, molecule bonding, metal bonding, polymer bonding etc. Molecule bonding is a method in which a surface of the DBG semiconductor structure is bonded directly to a surface of the SiP wafer. Molecule bonding may include exposing the surfaces to some surface activation process, e.g. a plasma, to facilitate the bonding, prior to placing the surfaces in contact with each other. Molecule bonding may result in good optical properties such that coupling of light between the DBG semiconductor structure and the SiP wafer is not disrupted.

The DBG semiconductor structure includes a direct bandgap semiconductor material. In one example the DBG semiconductor material is a group III-V semiconductor material. In one example the DBG semiconductor material is a group II-VI semiconductor material. In one example the DBG semiconductor material is a compound semiconductor. The DBG semiconductor structure may include a number of layers and may include a plurality of different semiconductor materials. In one example the DBG semiconductor structure includes at least one material selected from the group comprising: indium phosphide (InP), gallium arsenide (GaAs), Indium gallium arsenide (InGaAs), indium arsenide (InAs), aluminum gallium arsenide (AlGaAs), indium gallium arsenide phosphide (lnGaAsP), indium gallium aluminum arsenide (InGaAlAs), indium gallium arsenide nitride (lnGaAsN), indium gallium phosphide (InGaP), indium aluminum arsenide (InAlAs), indium antimonide (InSb), aluminum antimonide (AlSb), aluminum arsenide antimonide (AlAsSb), indium gallium antimonide (InGaSb) and indium gallium aluminum antimonide (InGaAlS).

In one example, the DBG semiconductor structure comprises a photonics device. In another example the DBG semiconductor structure comprises an unprocessed or partially processed die which may be further processed, after bonding to the SiP wafer, to form a photonics device. The photonics device may be a light emitting or light detecting device such as a laser, photodetector, optical modulator or optical amplifier etc.

In some examples there may be additional processes between receiving the assembly 100 in block 110 and bonding the DBG semiconductor structure 400 to the assembly 100 in block 120. For example, a substrate of the SiP wafer 300 of the assembly 100 may be removed before bonding the DBG semiconductor structure 400 to the SiP wafer. This and examples of other processes are described in more detail later.

At block 130 of method 10, the DBG semiconductor structure is optically coupled to the photonics circuitry in the SiP wafer. In this context, "optically coupling" the DBG semiconductor structure to the photonics circuitry in the SiP wafer means forming an optical structure by which an optical signal may be coupled in at least one direction between the DBG semiconductor structure and the photonics circuitry. This may make it possible for an optical signal generated by the DBG semiconductor structure to be transferred to the photonics circuitry and/or for an optical signal in the photonics circuitry to be transferred to the DBG semiconductor structure for detection.

The optical coupling of block 130 may form part of the bonding process of block 120 or may be a contemporaneous process or a subsequent process. For instance, the bonding process of block 120 may include aligning pre-existing optical structures of the SiP wafer with pre-existing optical structures of the DBG semiconductor structure to create an optical coupling between them. In other examples, at least one of the DBG semiconductor structure and the SiP wafer may be further processed after the bonding of block 120 to form optical structures which create the optical coupling. The optical coupling of the DBG semiconductor structure to the photonics circuitry may comprise forming an optical path including at least one of an evanescent coupling structure, a grating, a mirror and an angled facet. Examples are described in more detail later.

At block 140 of method 10, the DBG semiconductor structure is electrically connected to the electronic circuitry 201 in the CMOS wafer 200. This may allow the electronic circuitry 201 to at least one of: control operation of the DBG semiconductor structure and receive electrical signals from the DBG semiconductor structure. In one example, electrically connecting the DBG semiconductor structure to the electronic circuitry of the CMOS wafer may include connecting an electrical contact of the DBG semiconductor structure with a via that extends at least partially through the SiP wafer.

Figure 3:
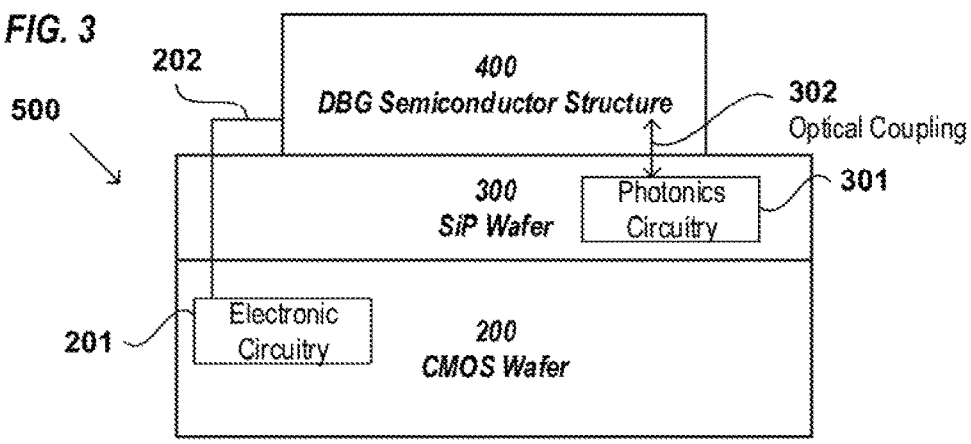
FIG. 3 is a schematic diagram showing an example assembly according to the present disclosure.

FIG. 3 shows an example of a hybrid photonics-electronics assembly 500 formed by the method 10 of FIG. 1. In the context of this disclosure, the term "hybrid" means that the assembly includes both a DBG semiconductor structure and silicon photonics. The assembly 500 comprises a SiP wafer 300 including photonics circuitry 301, which is bonded to a CMOS wafer 200 including electronic circuitry 201. A DBG semiconductor structure 400 is bonded to surface of the SiP wafer 300. The SiP wafer 300 is positioned between the DBG semiconductor structure 400 and the CMOS wafer 200. More specifically the SiP wafer 300 underlies the DBG semiconductor structure and overlies the CMOS wafer 200. This allows for convenient optical coupling between the DBG semiconductor structure 400 and the photonic circuit 301 in the SiP wafer 300. Furthermore, the DBG semiconductor structure 400 and the electronic circuitry 201 of the CMOS wafer 200 may generate significant heat, so positioning them at the top and bottom of the assembly may facilitate dissipation of heat to the surrounding environment or to a heat sink mounted to the top or bottom of the assembly. In this respect positioning the DBG semiconductor at the top of the assembly may be especially convenient, as it allows the heat generating DB G to be in closer contact with a heat sink, therefore allowing efficient heat extraction.

The DBG semiconductor structure 400 is electrically connected to the electronic circuitry 201 of the CMOS wafer by an electrically conductive line 202 and optically coupled to the photonic circuitry 201 of the SiP wafer as indicated by arrow 302. It should be noted that the optical coupling may be in one direction or both directions.

Figure 4A:
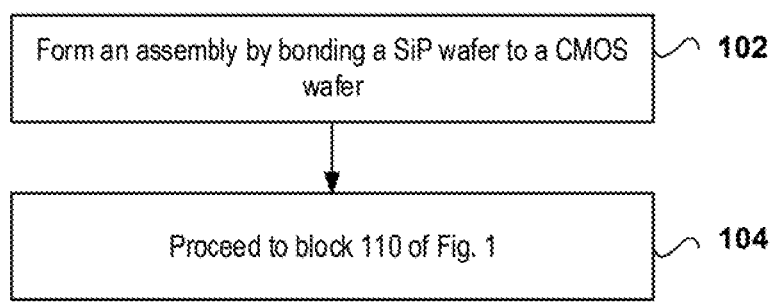
FIG. 4A is a flowchart showing an example method according to the present disclosure.
Figure 4B:
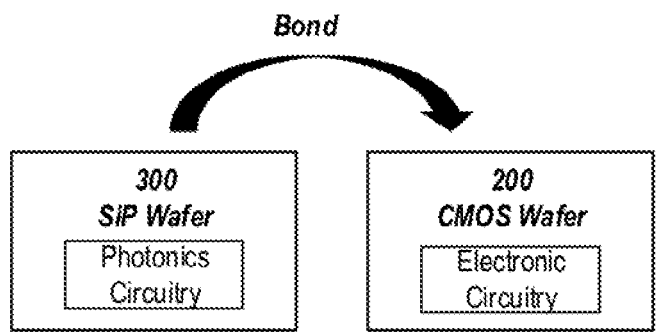
FIG. 4B is a schematic diagram showing an example of bonding of a Silicon photonics (SiP) wafer to a Complementary metal oxide semiconductor (CMOS) wafer.
Figure 4C:
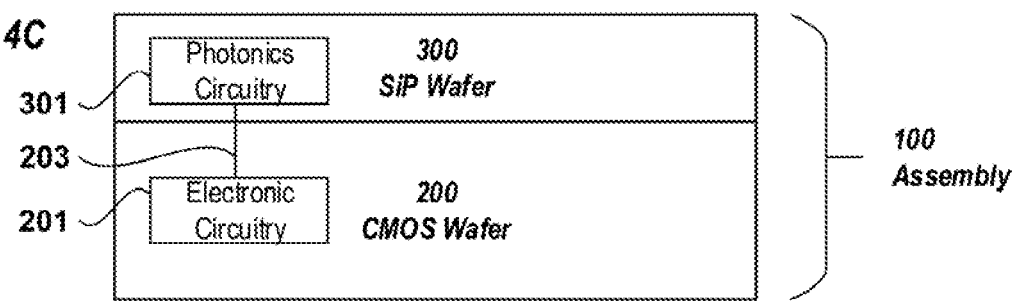
FIG. 4C is a schematic diagram showing an example assembly according to the present disclosure.

It will be appreciated that the method 10 of FIG. 1 comprises receiving an assembly 100 including a CMOS wafer and a SiP wafer which have already been bonded together. FIG. 4A is a flow diagram showing a previous stage 5 of the manufacturing process prior to FIG. 1. Thus at block 102 of FIG. 4A a SiP wafer is bonded to a CMOS wafer. This is shown schematically in FIG. 4B where a SiP wafer 300 including photonic circuitry 301 is bonded to a CMOS wafer 200 including electronic circuitry 201. The bonding at block 102 may be molecule bonding, metal bonding or polymer bonding etc. The bonding may form a strong mechanical connection between the CMOS wafer 200 and SiP wafer 300 such that they are fixed in place relative to each other. In some examples, the bonding may form an electrical connection 203 between the photonics circuitry 301 and the electronic circuitry 201 as shown in FIG. 4C. For example, respective surfaces of the CMOS wafer and the SiP wafer which are to be bonded together may include electrically conductive contacts which are aligned with each other when the CMOS wafer is bonded to the SiP wafer. This may allow the electronic circuitry to control the photonic circuitry and/or to send/receive electrically transmitted data or other signals to/from the photonic circuitry. In one example the bonding of the SiP wafer to the CMOS wafer is flip chip bonding. Flip chip bonding is a technique in which one wafer is flipped over so that its tops surface faces downwards and is bonded to the top surface of another wafer, as shown in FIG. 4B.

Figure 5A:
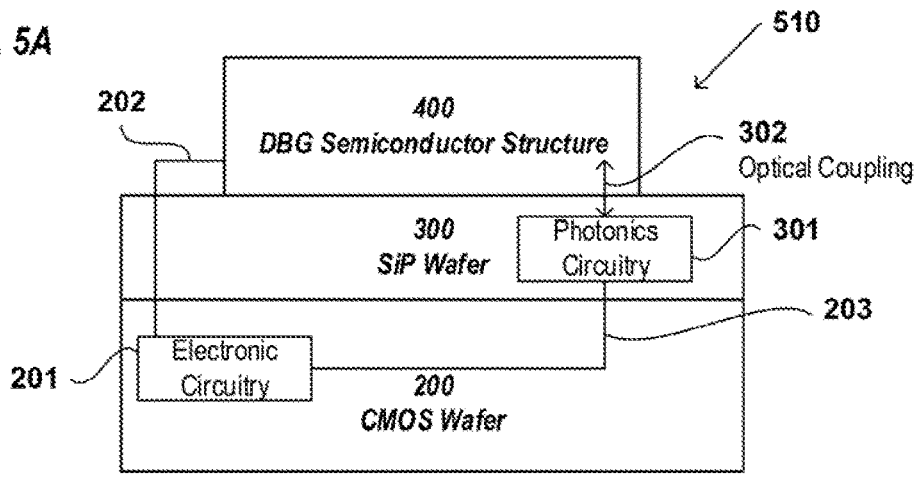
FIG. 5A-5C are schematic diagrams showing example assemblies according to the present disclosure.

FIG. 5A is a schematic diagram showing another example of a hybrid photonics-electronics assembly 510 formed by the method 10 of FIG. 1. It is the same as the example of FIG. 3, except that it shows an electrical connection 203 between the CMOS electronic circuitry 201 and the SiP photonic circuitry 301, as well as an electrical connection 202 between the CMOS electronic circuitry 201 and the DB G semiconductor structure 400. Thus FIG. 3 shows an arrangement in which the CMOS electronic circuitry 201 is not connected to the SiP photonic circuitry. This may be useful where the SiP photonic circuitry comprises passive photonic devices such as waveguides. FIG. 5A shows an arrangement in which there is an electrical connection 203 between the CMOS electronic circuitry 201 and the SiP photonic circuitry 301 and may be useful where the photonic circuitry 201 includes an active photonic device or a plurality of active photonic devices.

Figure 5B:
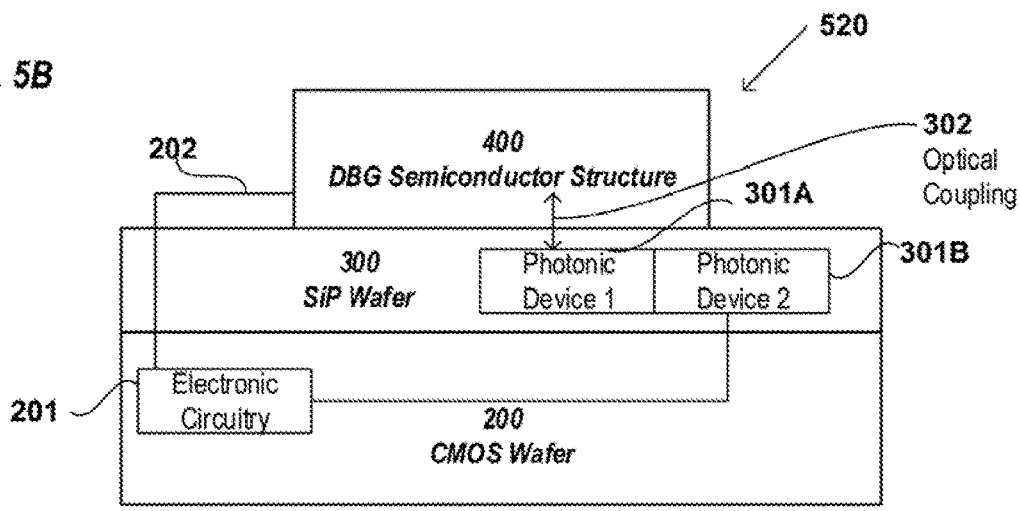

FIG. 5B is a schematic diagram showing a further example of a hybrid photonics-electronics assembly 520 formed by the method 10 of FIG. 1. It is the same as the example of FIG. 5A, but shows the photonic circuitry 301 in more detail. The photonic circuitry 301 comprises a plurality of photonic devices at least some of which perform different photonic functions to each other. The plurality of photonic devices includes a first photonic device 301A and a second photonic device 301B. In this example, the first photonic device 301A is optically coupled to the DBG semiconductor structure, but is not electrically connected to the electronic circuitry 201 of the CMOS wafer. The second photonic device 301B is electrically connected to the electronic control circuitry, but is not optically coupled to the DBG semiconductor structure. For example, the DBG semiconductor structure 400 may be a light generating device such as a laser, the first photonic device 301A may be a passive photonic device such as a waveguide which is to receive light generated by the DBG semiconductor structure, and the second photonic device 301B may be an active photonic device, such as an optical modulator, which is optically coupled to the first photonic device.

In general, a passive photonics device is a device which performs an optical function without using electrical power, while an active photonics device is a device which uses electrical power to interact with the light in the desired fashion. The photonics circuitry may comprise a plurality of active and passive photonic devices and the active photonic devices may be electrically connected to the CMOS electronic circuitry 201.

It will be appreciated that some implementations of the present disclosure may include complicated photonics circuitry including many photonic devices which operate under control of sophisticated CMOS electronic circuitry. Furthermore, the photonics circuitry may make use of an active DBG photonics device which is optically coupled to the photonics circuitry and may be controlled by the CMOS electronic circuitry. Possible applications include, but are not limited to, an optical transmitter or optical receiver and dense wavelength division multiplexing (DWDM). Furthermore, the CMOS electronic circuitry may include logic circuitry to perform complicated signal encoding and decoding operations. According to some implementations of the present disclosure, such a device may be provided on a single hybrid photonics-electronic integrated chip and may be manufactured at scale by using semiconductor fabrication techniques.

Figure 5C:
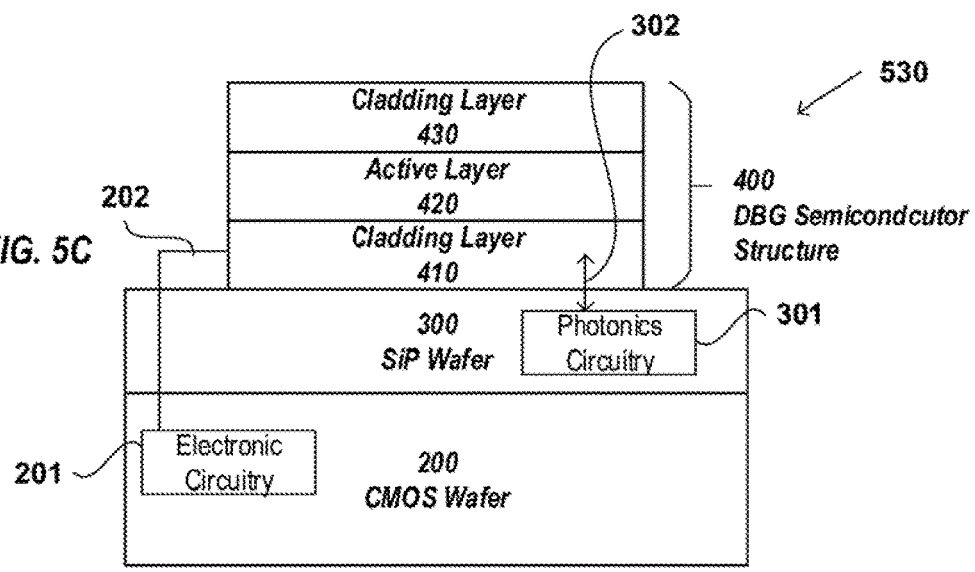

FIG. 5C is a schematic diagram showing another example of a hybrid photonics-electronics assembly 530 formed by the method 10 of FIG. 1. It is the same as the example of FIG. 3, except that it shows an example of the DBG semiconductor structure 400 in more detail.

The DBG semiconductor structure 400 shown in FIG. 5C includes an active layer 420 positioned between a first cladding layer 410 and a second cladding layer 430. For example, the first cladding layer 410 may be bonded to an upper surface of the SiP wafer 300, the active layer 420 may be positioned over the first cladding layer 410 and the second cladding layer 430 may be positioned over the active layer 420. While depicted as single layers for clarity in FIG. 5C, it is to be understood that each of the first cladding layer 410, active layer 420 and second cladding layer 430 may include one or more layers.

The active layer 420 may be a layer which is to generate or amplify light in response to application of an electric potential, or to generate an electrical current in response receiving photons. The active layer may, for example, be a gain region of a laser, amplifier or modulator. In one example, the active layer 420 is a quantum well layer and may include one or more quantum wells or quantum dots. The cladding layers 410 and 430 may at least partially optically confine photons within the active layer 420. The cladding layers may be positively or negatively doped. In one example the cladding layers and active layer together form a p-i-n structure. At least the active layer 420 is formed of a DBG semiconductor material. The cladding layers 410, 430 may also comprise a DBG semiconductor material of the same, or a different, type. The DBG semiconductor structure 400 may, for example, be a blank epitaxial die which is to be processed to form a DBG photonic device, or may be a partially or fully processed die. In some examples, the DBG semiconductor structure 400 may include the active layer 420 and the cladding layer 430 which is above the active layer, but not the cladding layer 410 which is below the active layer. In such examples the active layer 420 may be bonded directly to the upper surface of the SiP wafer 300. In that case one of the dielectric layers in the SiP wafer, e.g. layer 330 or 310, may act as the lower cladding layer.

Figure 6A:
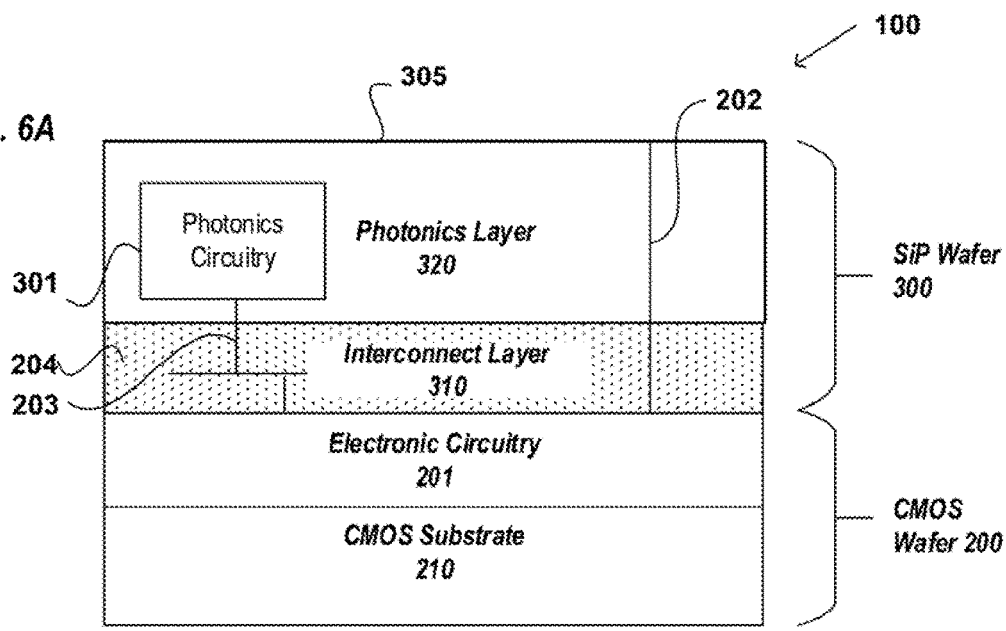
FIG. 6A-6B are schematic diagrams showing example assemblies according to the present disclosure.
Figure 6B:
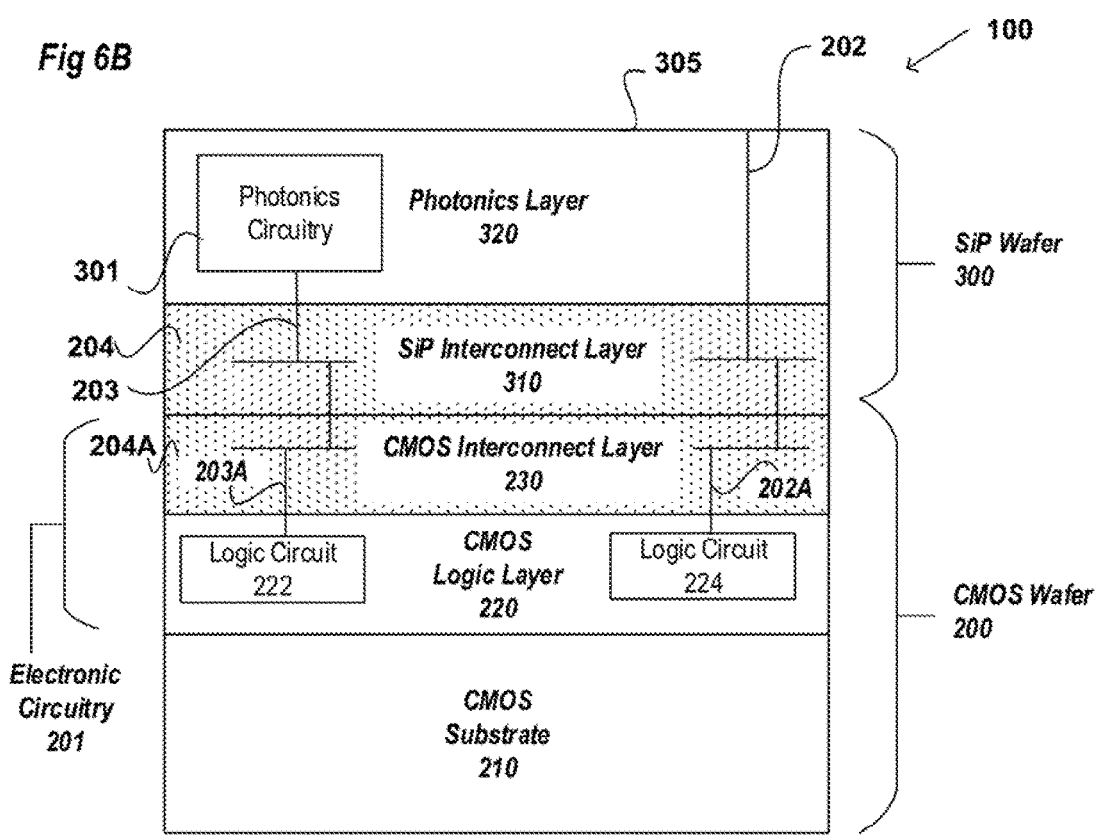

FIG. 6A is a schematic diagram showing an example structure of a CMOS-SiP wafer assembly 100, such as the assembly manufactured in FIG. 4A, in more detail. The CMOS wafer 200 includes a substrate 210 and an electronic circuitry layer 201 positioned over the substrate. The SiP wafer 300 comprises a photonics layer 320 which includes the photonics circuitry 301 and an electrical interconnect layer 310 which is positioned under the photonics layer 320. One side of the electrical interconnect layer 310 may be adjacent the photonics layer 320 and the other side may be bonded to the CMOS wafer 200. The electrical interconnect layer 310 includes at least one electrically conductive line 203 which is embedded in electrically insulating material 204. The electrically conductive line 203 may connect the photonic circuitry 301 with the electronic circuitry 201 of the CMOS wafer 200. Another electrically conductive line 202 is shown in FIG. 6B which includes a via extending from the interconnect layer 310 through the photonics layer 320 to an upper surface 305 of the photonics wafer 300. The via may later form part of an electrical path linking the electronic circuitry 201 to the DB G semiconductor structure 400 (not shown in FIG. 6A) which is later to be bonded to the upper surface 305 of the SiP wafer.

In another example, the electrically conductive line 202 may connect the electronic circuitry 201 of the CMOS wafer 200 to an electrical contact which is to receive power from an external power supply. In another example, the electrically conductive line 202 may connect the electronic circuitry 201 to an electrical contact for receiving electrical control signals from, or sending electrical controls signals to an external device.

FIG. 6B is another schematic diagram of a CMOS-SiP assembly 100, which is similar to FIG. 6A, but shows an example structure of the electronic circuitry 201 of the CMOS wafer 200 in more detail. Specifically, the electronic circuitry 201 may include a logic layer 220 comprising at least one logic circuit 222, 224 and a CMOS interconnect layer 230. The CMOS interconnect layer 230 may comprise at a number of electrically conductive lines 203A, 202A embedded in an electrically insulating material 204A to electrically connect the logic circuits 222, 224 with a corresponding electrically conductive line 203, 202 of the SiP interconnect layer 310. The logic circuits 222, 224 may include a number of transistors or logic gates or a processor, for example. The electrically conductive line 202 may include a via which extends at least partially through the SiP wafer 300. In the example of FIG. 6B, the via extends all the way through the photonics layer 320 and part of the way through the SiP interconnect layer.

While two separate logic circuits 222, 224 are shown in FIG. 6B, in other examples there may be just one logic circuit or a larger number of logic circuits. Likewise, there may be a large number of electrically conductive lines and any of the logic circuits may be connected to both electrically conductive lines 202A and 203A.

Any CMOS compatible materials may be used for the various layers of the CMOS wafer 200 and the SiP wafer 300 described above. In one example, the photonics layer 320 includes silicon as an optical medium. The silicon may have been processed using semiconductor fabrication techniques to form the photonics circuitry. The photonics circuitry may include other CMOS compatible materials. For example materials having a different refractive index to silicon, such as silicon dioxide. The photonics circuitry may include germanium, germanium oxides, germanium and silicon alloys etc for forming active or passive photonic devices and may include electrically conductive materials to form contacts for active photonics devices. The electrically insulating material 204 of the SiP interconnect layer 310 may have a lower refractive index than silicon in order to help prevent light from leaking out of the photonics layer 320 into the CMOS wafer. The electrically insulating material 204A of the CMOS interconnect layer 230 may be, but does not have to be, the same as the electrically insulating material 204 of layer 310 so as to keep the refractive indexes and thermal expansivity of the layers the same. In one example the electrically insulating material is a dielectric such as silicon dioxide. The electrically conductive lines 203, 203A, 202 and 202A may comprise any appropriate material, including but not limited to copper, aluminum, indium tin oxide etc.

Figure 7:
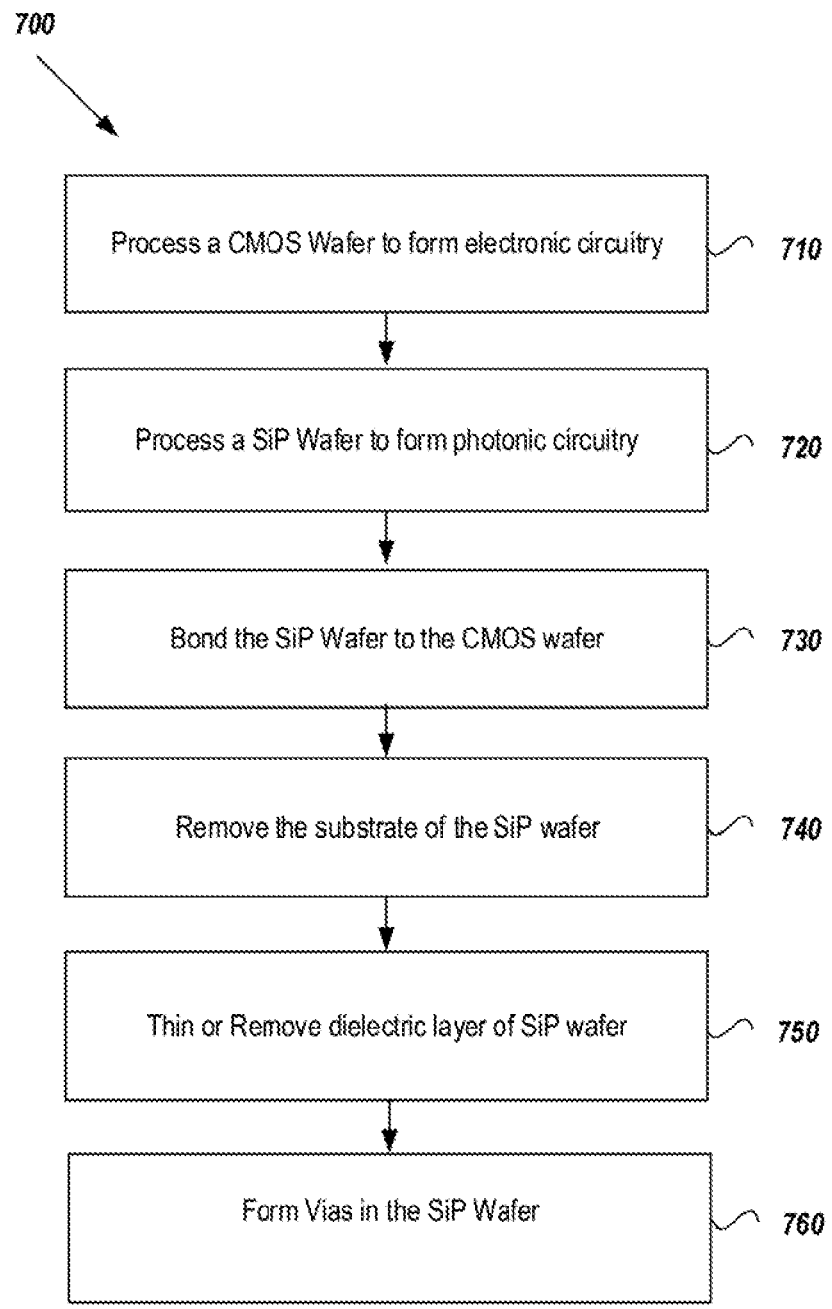
FIG. 7 is a flowchart showing an example method according to the present disclosure.

FIG. 7 is a flow chart showing an example method 700 of manufacturing a CMOS wafer-SiP wafer assembly 100. The following description of the flow chart may be read in conjunction with FIGS. 8A-8F which are cross sectional views of the assembly 100 at various stages of the manufacturing process.

Figure 8A:
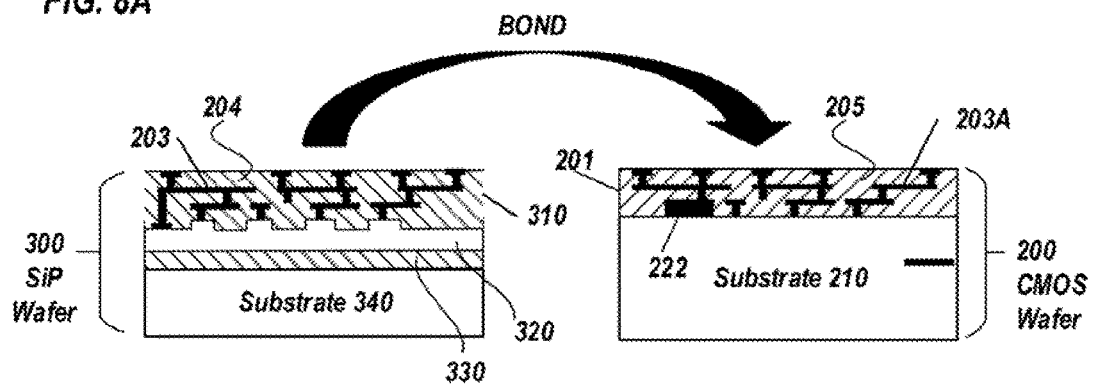
FIGS. 8A to 8F are cross sectional diagrams showing examples of various stages of manufacture of an assembly according to the method of FIG. 7.

At block 710 a CMOS wafer is processed to form electronic circuitry. The processing may include processing a silicon substrate 210 to form electronic circuitry 201. The processing may include material deposition, etching, patterning and doping etc in order to form and connect the various electronic components. FIG. 8A shows an example of the CMOS wafer 200 including a substrate 210 and an electronic circuitry layer 201. The electronic circuitry layer may include a plurality of electrically conductive lines 203A and at least one electronic logic circuit 222, both of which are embedded in an electrically insulating material 205. The electrically conductive lines 203A may connect the at least one electronic logic circuit 222 to another electronic logic circuit in the CMOS wafer and/or to electrically conductive contacts on an upper surface of the CMOS wafer.

At block 720 a SiP wafer is processed to form photonics circuitry. An example of the SiP wafer 300 is shown in FIG. 8A. The SiP wafer may start as a silicon on insulator (SOI) wafer including a silicon layer 320 over a dielectric layer 330, such as silicon dioxide, over a silicon substrate 340. The dielectric layer 330 is electrically insulating and may have a lower refractive index than the silicon layer 320 so as to help confine light in the silicon layer 320. Photonics circuitry may be formed in the silicon layer 320, which after the formation of photonics circuitry may be referred to as the "photonics layer". Creating the photonics circuitry may include semiconductor fabrication techniques such as material deposition, etching, patterning and doping etc. The SiP wafer further includes an electrical interconnect layer 310 positioned over the photonics layer 320. The electrical interconnect layer 310 may include an electrically insulating material 204 such as silicon dioxide and a plurality of electrically conductive lines 203 embedded in the electrically insulating material. The electrically conductive lines 203 may extend to contacts on an upper surface of the SiP wafer and at least some of the lines 203 may connect to electrical contacts of active photonic devices in the photonic circuitry in layer 320.

Blocks 710 and 720 may be carried out at CMOS production site. While they may be carried out on the same production line, usually the CMOS wafer processing and SiP wafer processing will be carried out on separate production lines, as photonic devices are much larger than the transistors in modern integrated circuits and so older and cheaper equipment may be used to form the photonic circuitry.

At block 730 the SiP wafer is bonded to the CMOS wafer. This may involve any of the methods described above in relation to FIGS. 4A-4C and FIGS. 6A-6B.

Figure 8B:
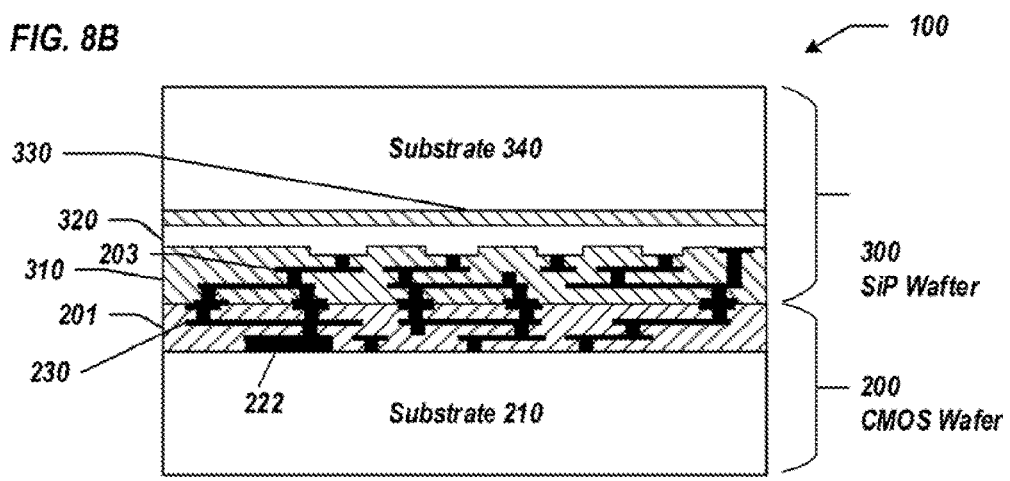

FIG. 8B is similar to FIG. 4C and shows the CMOS wafer 200 and SiP wafer 300 of FIG. 8A after they have been bonded together to form an assembly 100.

Figure 8C:
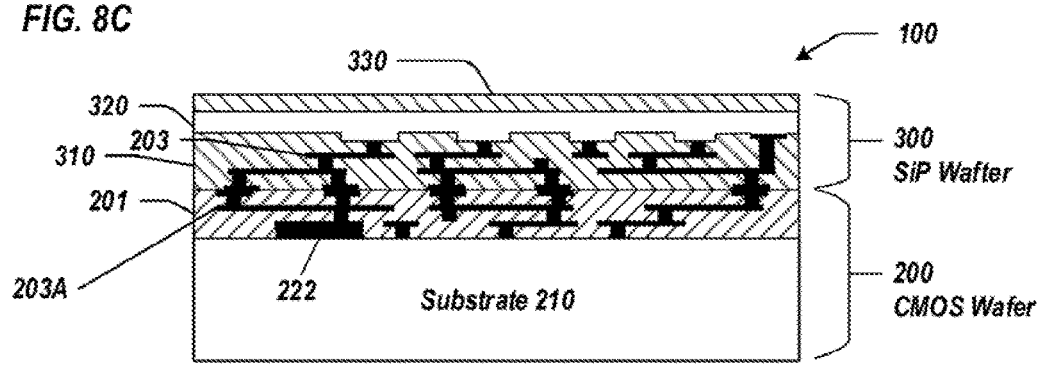

At block 740 the substrate 340 of the SiP wafer is removed. For example the substrate 340 may be chemically etched away. This may leave the oxide layer 330 as an exposed upper layer of the SiP wafer, as shown in FIG. 8C.

At block 750 the dielectric layer 330 is thinned or removed, for example by chemical etching. In other examples, the dielectric layer 330 may be maintained at the same thickness or even thickened. Further, in some examples the substrate 340 is not removed.

If the substrate 340 is removed and the dielectric layer 330 is thinned or removed, this may later facilitate optical coupling between the photonics circuitry of the photonics layer 320 and DBG semiconductor structure 400 which is added later. Another reason for removing the substrate 340 and removing or thinning the dielectric layer 330, may be to reduce the distance between the electronic circuitry 201 and the upper surface of the SiP wafer. This may lead to a shorter electrically conductive line and quicker transmission of electrical signals between the electronic circuitry 201 and the DBG semiconductor structure 400.

At block 760 vias 208 are formed in the SiP wafer 300. The vias 208 extend at least partially through the SiP wafer. For example the vias 208 may extend through the photonics layer 320, through the dielectric layer 330 (if it has not been removed) and through the substrate 340 (if it has not been removed) to the upper surface of the SiP wafer. The vias 208 may extend all the way through the electrical interconnect layer 310, or connect with electrically conductive lines in the interconnect layer 310, to form an electrically conductive line linking the upper surface of the SiP wafer with the electronic circuitry 201 of the CMOS wafer.

Figure 8D:
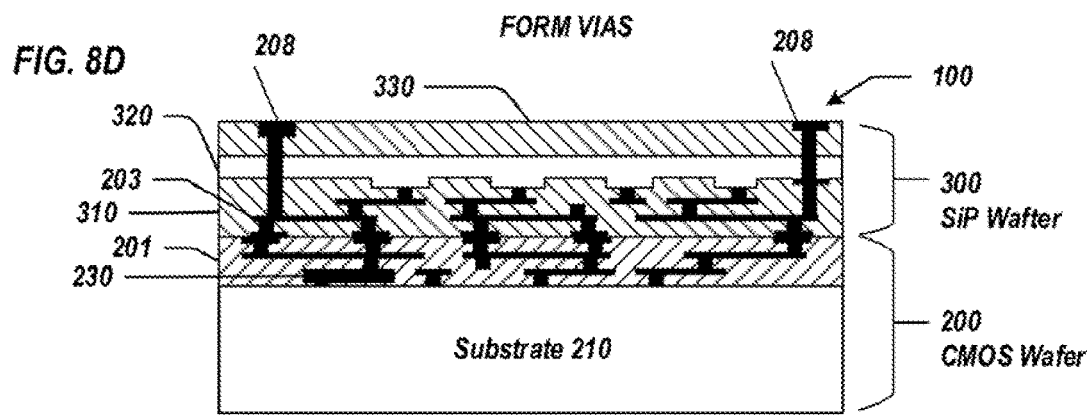
Figure 8E:
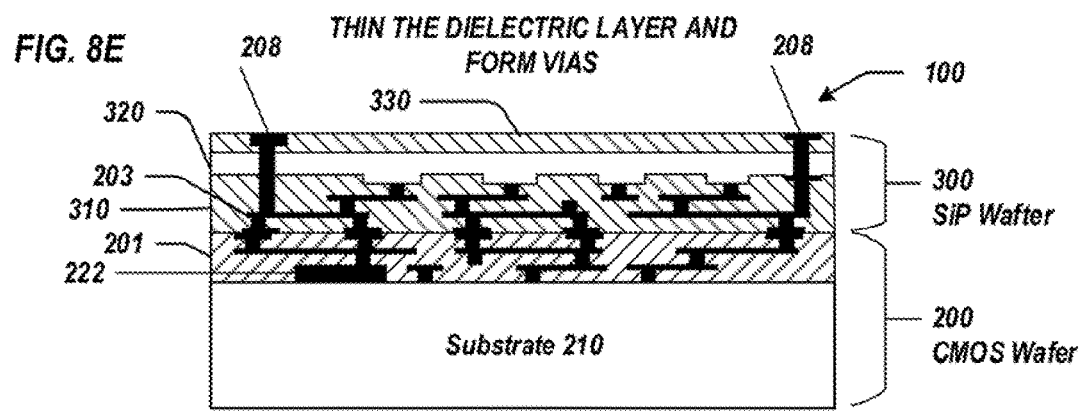
Figure 8F:
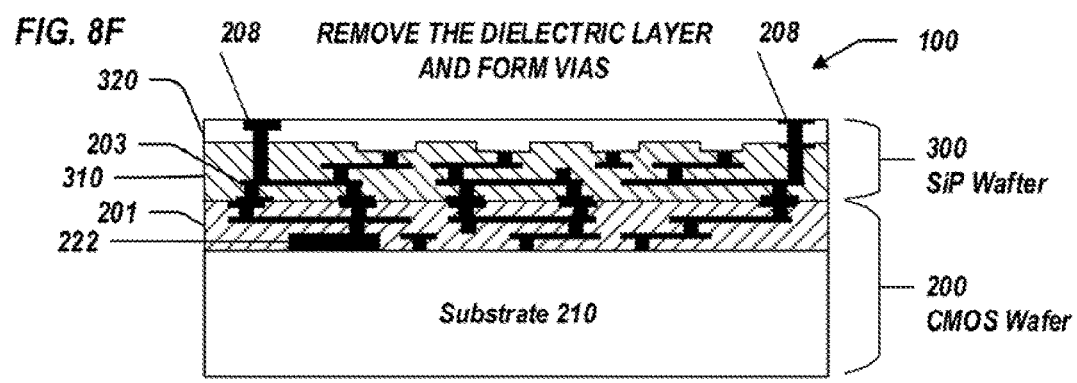

FIG. 8D shows an example of the assembly after the vias 208 have been formed. FIG. 8E shows another example, which is the same as FIG. 8D, but in which the dielectric layer 330 has been thinned and has a reduced thickness compared to the dielectric layer 330 in FIGS. 8A-8D. FIG. 8F shows yet another example, which is the same as FIG. 8D, but in which the dielectric layer 330 has been removed.

Figure 9:
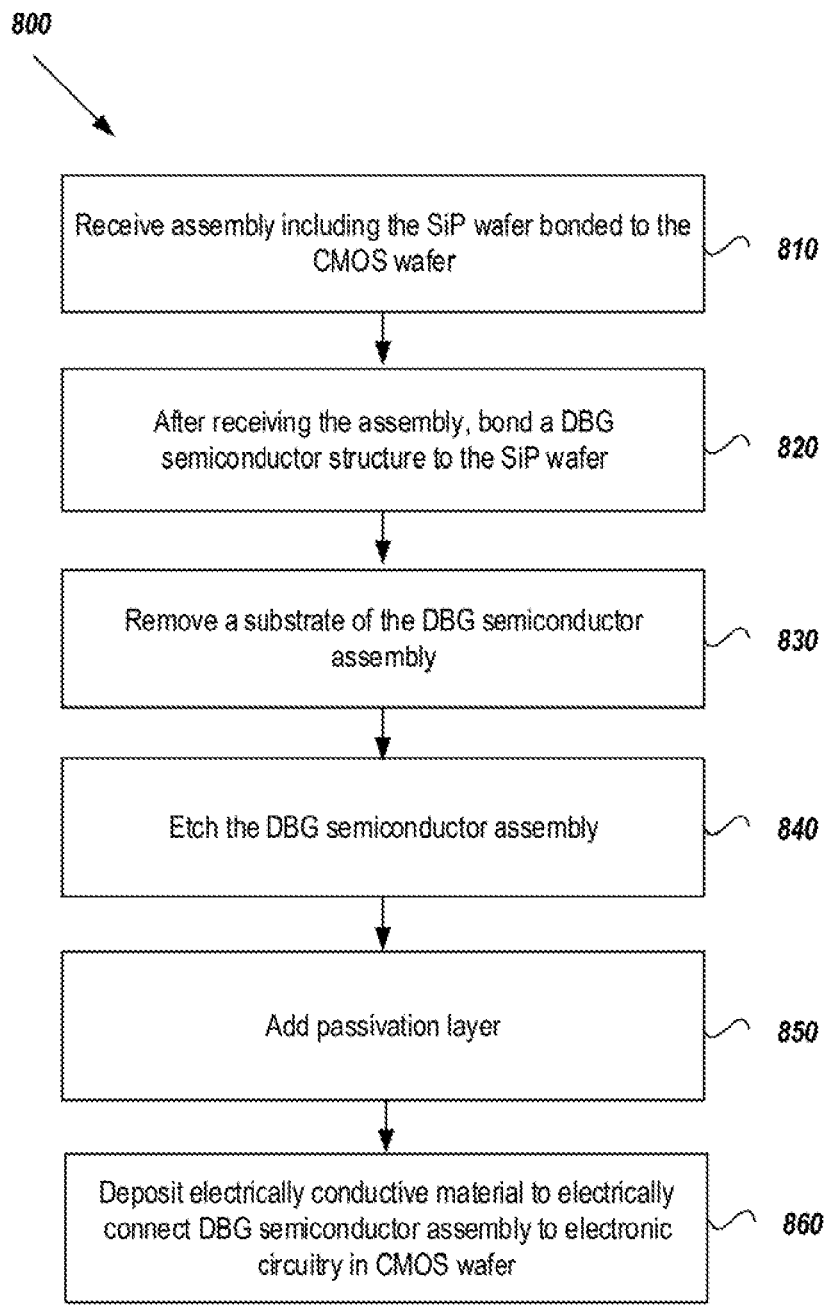
FIG. 9 is a flowchart showing an example method according to the present disclosure.

FIG. 9 is a flow diagram showing an example method 800 of manufacturing a hybrid photonics-electronic assembly in detail. FIG. 9 may be read together with FIGS. 10A to 10D which show cross-sectional views of the hybrid assembly at various stages of the manufacturing process.

At block 810 an assembly 100 is received. The assembly includes a SiP wafer 300 bonded to a CMOS wafer 200. This is the same as block 110 of method 10 of FIG. 1.

At block 820 a DBG semiconductor structure 400 is bonded to the received assembly. This is the same as block 120 of FIG. 1 and may employ any of the methods described above in relation to FIGS. 1, 3 and 5A to 5C.

The assembly 100 which is received at block 810 may, for example, be similar to that shown in any of FIGS. 8D to 8F. In other examples, the received assembly 100 may be similar to that shown in FIG. 8C, in which case the vias 208 may be formed after the bonding of the DBG semiconductor structure 400 to the SiP wafer 300. In other examples, the received assembly 100 may be similar to that shown in FIG. 8B, in which case the substrate 300 may be maintained or thinned prior to the bonding of the DBG semiconductor structure 400 to the SiP wafer 300.

Figure 10A:
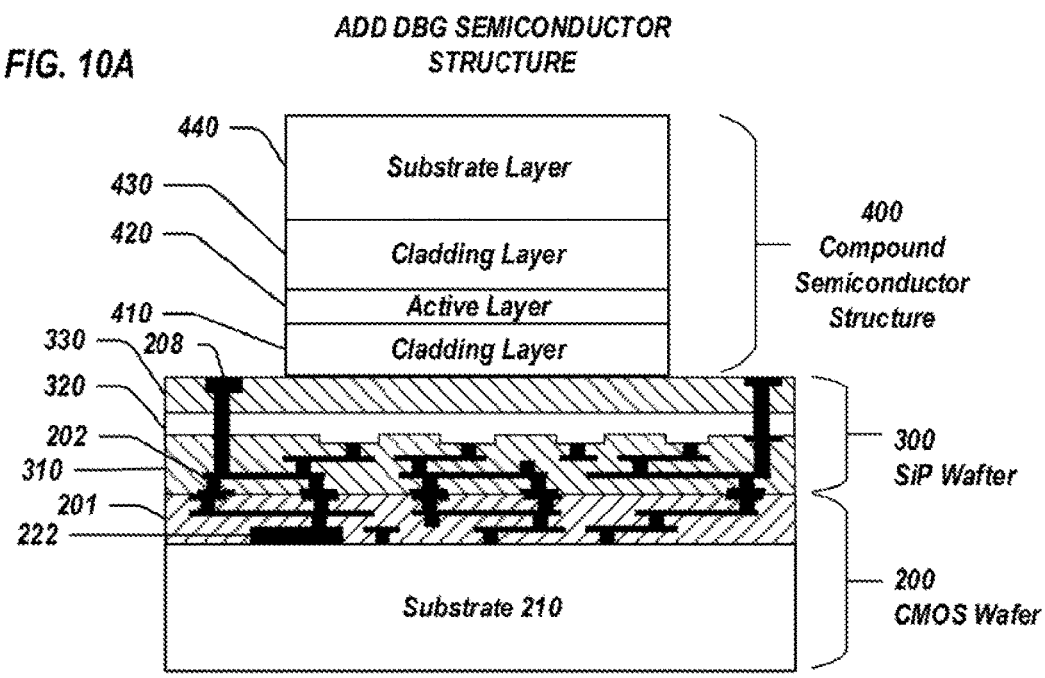

FIG. 10A shows an example of the hybrid assembly after the DBG semiconductor structure 400 has been bonded to the SiP wafer 300. The DBG semiconductor structure 400 is similar to that shown in FIG. 5C and includes an active layer 420 between two cladding layers 410, 430. These layers may be as described in relation to FIG. 5C and may comprise similar materials as described in relation to FIG. 5C. The DBG semiconductor structure 400 further includes a substrate layer 440 over the upper cladding layer 430. The substrate layer 430 may, for example, comprise an undoped DBG semiconductor material. The substrate layer may have been used as a handling layer to hold the DBG semiconductor structure during in bonding process of block 820.

Figure 10B:
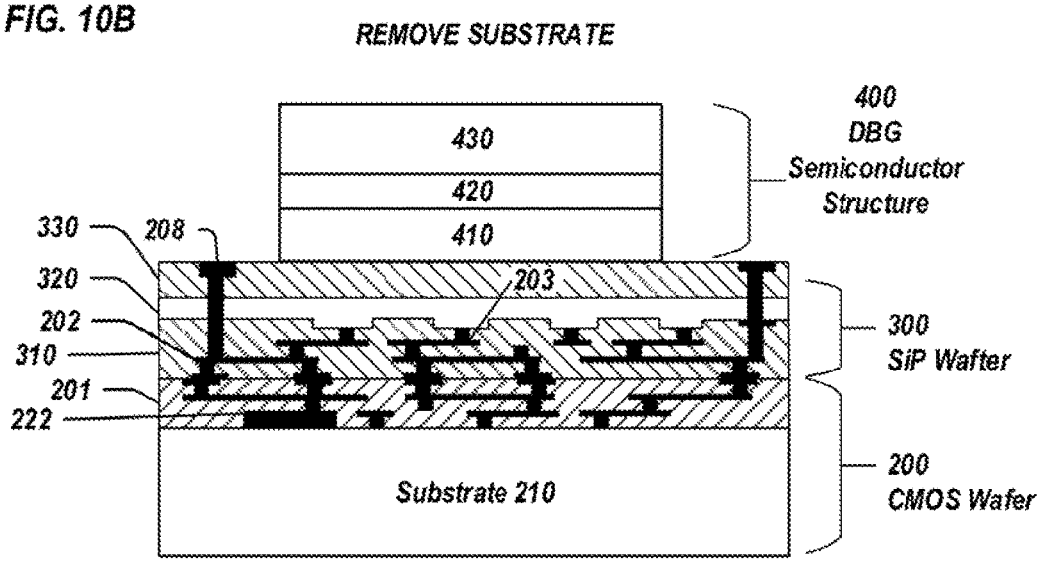

At block 830 the substrate layer 440 of the DBG semiconductor assembly may be removed. The resulting structure after removal of the substrate layer 440 is shown in FIG. 10B.

Figure 10C:
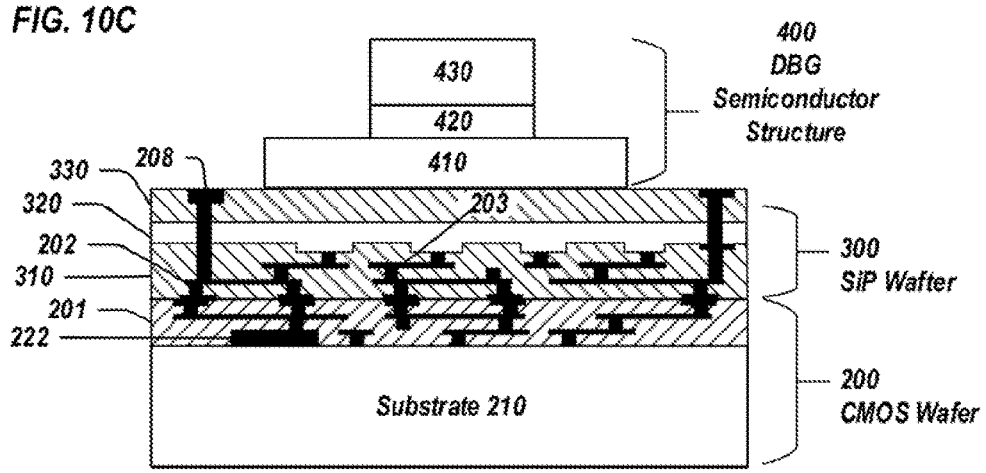

At block 840 the DBG semiconductor structure 400 may be etched. The etching may be to form an optical structure to confine light in an active region of the DBG semiconductor structure. An example of the structure after etching is shown in FIG. 10C. It can be seen that, in this example, the upper cladding layer 430 and the active layer 420 are narrower than the lower cladding layer 410. This may help to confine light within an optical mode of the active layer 420 as the refractive index of the active layer 420 may be higher than the surrounding air, or higher than a surrounding layer which is deposited later.

Figure 10D:
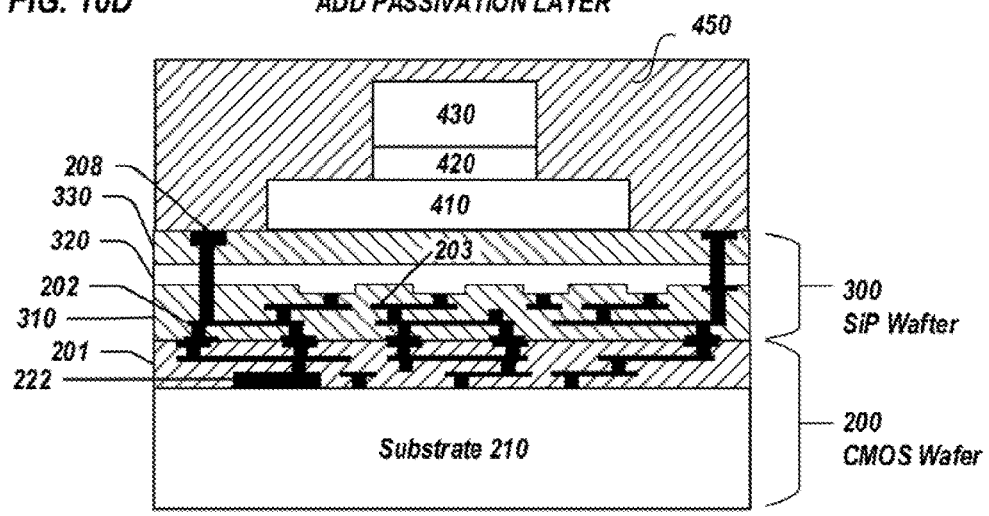

At block 850 a passivation layer 450 is deposited over the DBG semiconductor structure 400. The passivation layer 450 may for example be a dielectric or polymer material and may electrically isolate and mechanically protect the DBG semiconductor structure. Further, as mentioned above, the passivation layer may have a lower refractive index than the active layer 420 and the cladding layers 410, 430 so as to confine light within the DBG semiconductor structure. An example of the assembly after depositing the passivation layer is shown in FIG. 10D.

At block 860 an electrically conductive material is deposited to electrically connect the DBG semiconductor assembly 400 to the electronic circuitry 201 in CMOS wafer. This may, for example, include forming electrical contacts of the DBG semiconductor structure and connecting these electrical contacts to the vias 208. Block 860 may include a plurality of etching and deposition processes to achieve the desired electrical connections. FIG. 10E shows an example of an assembly 540 in which electrical connections 461, 462 are formed to connect upper and lower layers of the DBG semiconductor assembly to vias 208. Thus, by applying an electric potential between the connections 461, 462 the electronic circuitry 201 may apply a potential difference across the active layer 420 of the DBG semiconductor structure.

In some implementations, there may be one or more further vias, similar to the vias 208 shown in FIG. 10E. These further vias may be extended through the passivation layer 450 as well as the at least part of the SiP wafer 300 in order to connect the electronic circuitry 201 with one or more external electrical contacts (not shown) on an outside surface of the assembly 540. These electrical external electrical contacts and further vias may be used to route electrical power from an external power supply to the electronic circuitry 201, to route electric control signals from an external device to control the electronic circuitry 201, or to send electrical signals from the electronic circuitry 201 to an external device.

In the example shown in FIGS. 10A to 10E, a blank epitaxial die 400 for forming a DBG laser was bonded to the SiP wafer in FIG. 10B and subsequently processed to form a DBG laser as shown in FIG. 10E. In other examples a partially or fully pre-processed DBG laser may be bonded to the SiP wafer. In that case, depending on the extent of pre-processing, some or all of blocks 830 to 850 need not take place. In the case of a fully pre-processed DBG laser, electrical connection of the laser to the vias 208 may still be performed, although the electrical contact pads of the DBG laser may already been in place.

While a single die of the CMOS and SiP wafers has been shown in the figures above, it is to be understood that the CMOS wafer may include a plurality of electronic integrated chips and the SiP wafer may include a plurality of integrated photonic chips. The process blocks of FIG. 7 may be carried out at the wafer level, where each wafer includes a plurality of integrated chips. The process blocks of FIG. 9 may be carried out at the wafer level or the chip level. In one example, at least blocks 810 and 820 are carried out at the wafer level for enhanced process efficiency. Blocks 830 to 850 may be carried out at either the wafer level or the chip level.

FIGS. 11A to 11D show cross sectional examples of stages in the manufacturing process when carried out at the wafer level.

Figure 11A:
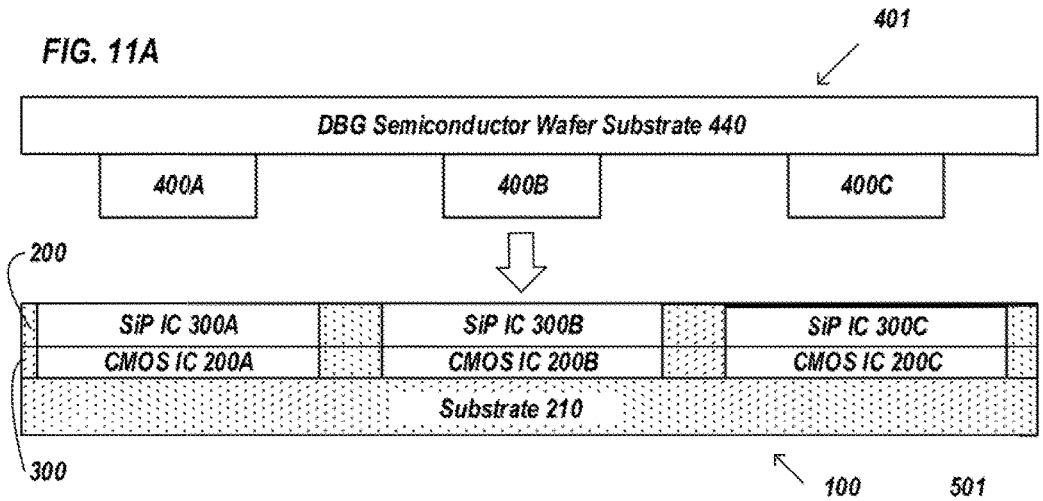
FIG. 11A is a schematic cross sectional diagram showing an example of bonding of a direct bandgap (DBG) semiconductor wafer to an assembly comprising a SiP wafer and a CMOS wafer according to the present disclosure.

Thus, FIG. 11A shows bonding of a DBG wafer 401 including a plurality of DBG semiconductor structures 400A, 400B, 400C on a common substrate 440 to a CMOS-SiP wafer assembly 100. The assembly 100 comprises a SiP wafer 300 bonded to a CMOS wafer 200. The SiP wafer includes a plurality of photonic integrated circuits 300A, 300B, 300C, while the CMOS wafer 200 includes a plurality of electronic integrated circuits 200A, 200B, 200C. The SiP wafer 300 is bonded to the CMOS wafer 200 and they may share the same substrate 210. Each respective electronic integrated circuit 200A, 200B, 200C in the CMOS wafer 200 may be electrically connected to a respective photonic integrated circuit 300A, 300B, 300C in the SiP wafer 300.

Figure 11B:
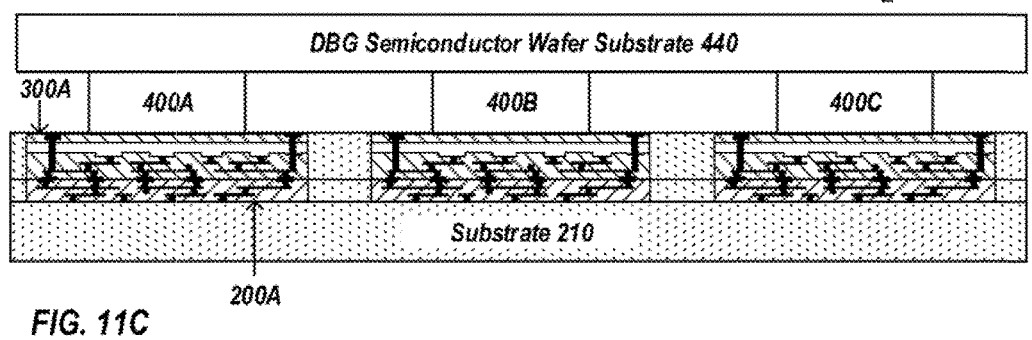
FIG. 11B is a schematic cross sectional diagram showing an example of a hybrid photonics-electronics wafer assembly according to the present disclosure.

FIG. 11B shows the resulting hybrid photonics-electronic wafer assembly 501 after the DBG wafer 401 has been bonded to the CMOS-SiP wafer assembly 100. While the electronic integrated circuits 200A, 200B, 200C and photonic integrated circuits 300A, 300B, 300C were shown schematically in FIG. 11A, they are shown in a greater level of detail in FIG. 11B, similar to that of FIGS. 10A to 10E. Each electronic integrated circuit and photonic integrated circuit may have any of the features discussed above in relation the CMOS wafer and SiP wafer, for instance but not limited to the features described with reference to FIGS. 4C to 6B, 8A to 8F and 10A to 10E.

The DBG semiconductor structures 400A, 400B, 400C may be photonic devices or dies which may be processed to form photonic devices. They may have any of the features of the DBG semiconductor structures described above, for example with reference to but not limited to that described in relation to FIG. 5C and FIGS. 10A to 10E. As a result of the bonding in FIG. 11A, or as a result of further processing carried out after the bonding of FIG. 11A, each respective DBG semiconductor structure 400A, 400B, 400C of the DBG semiconductor wafer 401 is optically coupled to a respective photonic integrated circuit 300A, 300B, 300C of the SiP wafer 300.

Figure 11C:
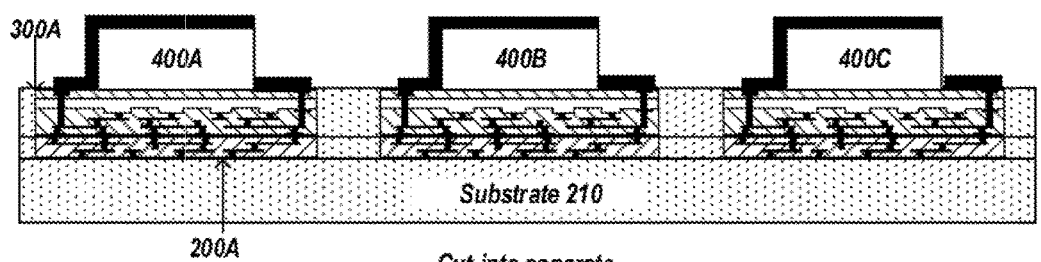
FIG. 11C is a schematic cross sectional diagram showing an example of a hybrid photonics-electronics wafer assembly according to the present disclosure.

FIG. 11C shows the hybrid photonics-electronic wafer assembly 501 after each DBG photonic device 400A, 400B, 400C has been electrically connected to a respective electronic integrated circuit 200A, 200B, 200C.

Figure 11D:
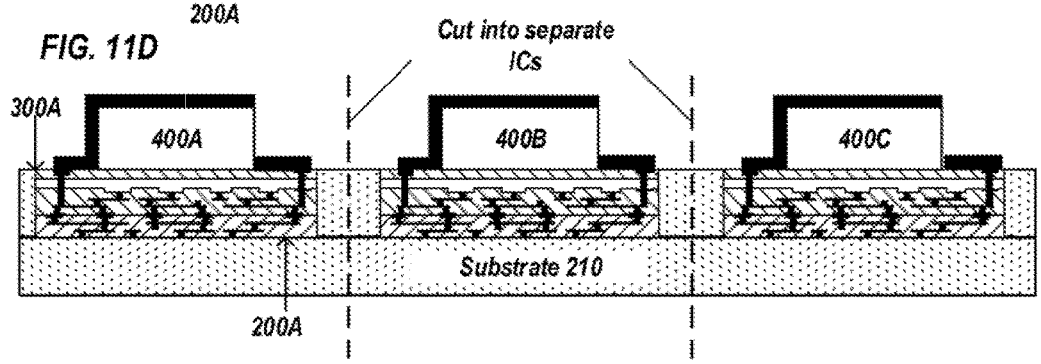
FIG. 11D is a schematic cross sectional diagram showing an example of cutting the assembly of FIG. 11C into separate hybrid photonic electronics integrated chips according to the present disclosure.

FIG. 11D shows the hybrid photonics-electronic wafer assembly 501 being cut into separate hybrid photonics-electronics integrated chips.

In the example of FIGS. 11A to 11D each process is carried out at the wafer level. However, in other examples, the order of the electrical connection and the cutting into separate chips may be reversed. Thus, in other examples, the hybrid photonics-electronic wafer assembly may be cut into separate hybrid photonics integrated chips before individually connecting each DBG photonic device to a corresponding electronic integrated circuit.

12A is a schematic cross sectional view of a hybrid photonics-electronics integrated chip formed by the above methods.

The hybrid photonics-electronics integrated chip includes a complementary metal-oxide-semiconductor (CMOS) layer 200, a silicon photonics (SiP) layer 300 bonded to the CMOS layer 200 and a direct bandgap (DBG) semiconductor layer 405 bonded to the SiP layer 300. The CMOS layer 200 includes electronic circuitry 201. The SiP layer includes photonics circuitry 301.

The DBG semiconductor layer 405 includes a DBG semiconductor photonics device 400 which is optically coupled 302 to the photonics circuitry 301 of the SiP layer 300.

An electrically conductive line 202 connects the electronic circuitry 201 of the CMOS layer to an electrical contact 460 of the DBG semiconductor photonics device 400. In this way the electronic circuitry may control the DBG semiconductor photonics device and/or receive a signal from the DBG semiconductor device. For instance, in one example the electronic circuitry is electronic control circuitry to control a light emitting DBG semiconductor device. In another example the electronic circuitry is electronic circuitry to receive and process a signal from a light detecting photonic device such as a photodetector.

The electrically conductive line 202, which connects the electronic control circuitry 201 with the electrical contact 460 of the DBG semiconductor photonics device 400, may include an electrically conductive via which extends at least partially through the SiP layer 300.

Figure 12A:
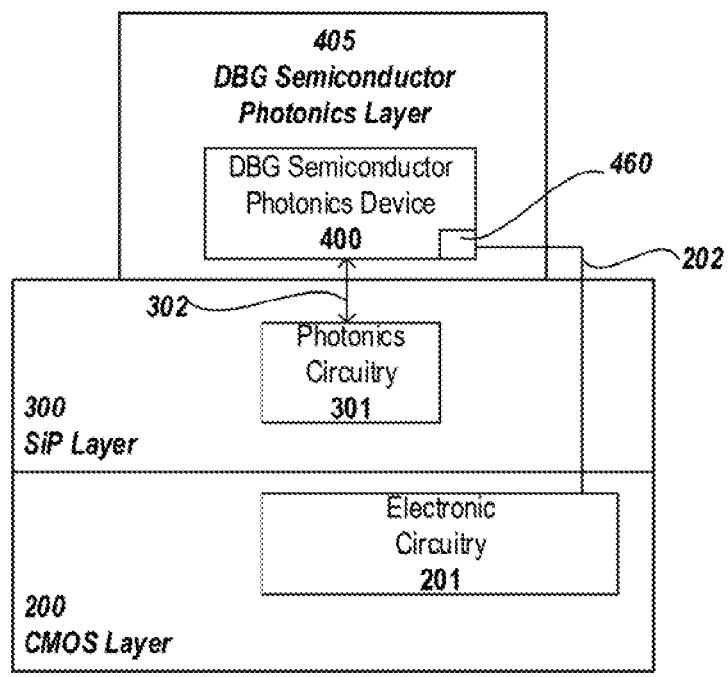
FIGS. 12A to 12C are schematic diagrams showing examples of hybrid photonic electronics integrated chips according to the present disclosure.
Figure 12B:
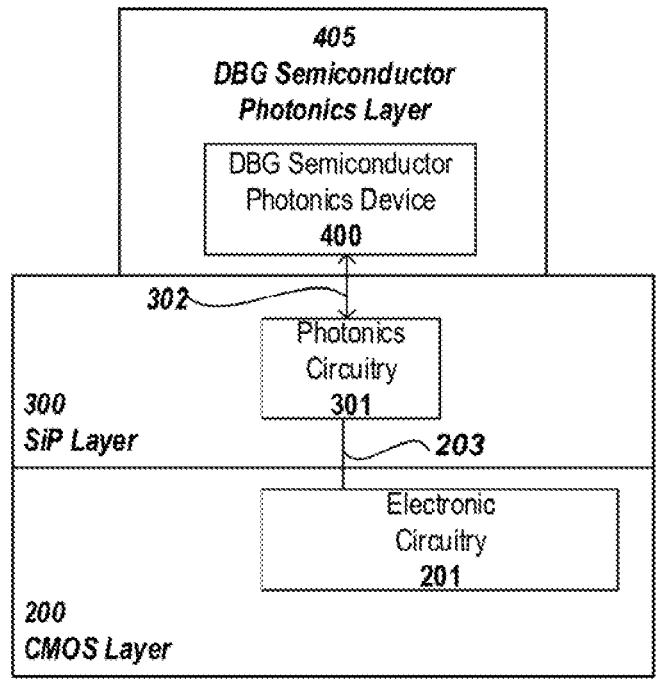

FIG. 12B is a schematic cross sectional view of another example hybrid photonics-electronics integrated chip, which is similar to the chip of FIG. 12A except that it does not include an electrically conductive line 202 to connect the electronic control circuitry 201 with the DBG semiconductor photonics device 400. Instead, there is an electrically conductive line 203 which connects the electronic control circuitry 201 of the CMOS layer to the photonics circuitry 301 in the SiP layer 300. In this way the electronic control circuitry 201 may control and/or receive data or other signals from the photonics circuitry 301.

Figure 12C:
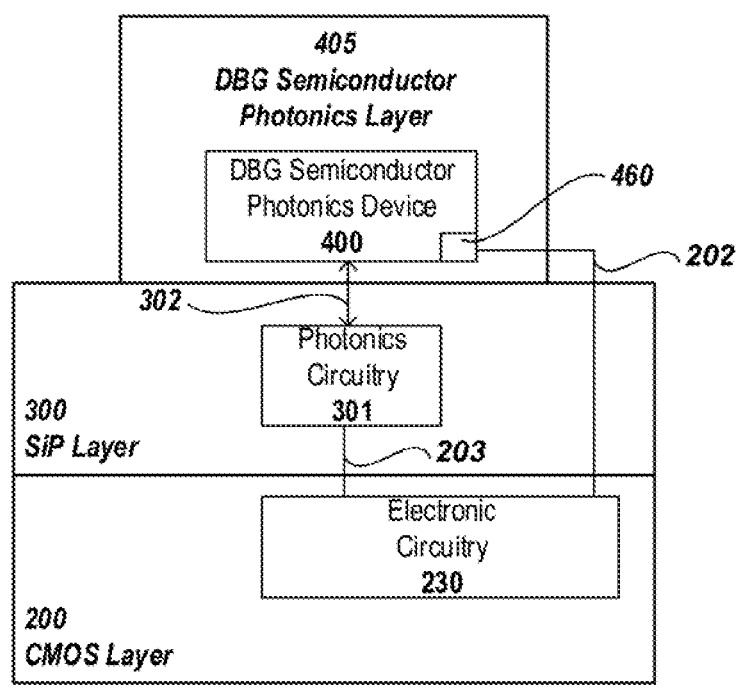

FIG. 12C is a schematic cross sectional view of another example hybrid photonics-electronics integrated chip, which is similar to the chip of FIG. 12A, but includes both an electrically conductive line 202 which connects the electronic control circuitry 201 with the DBG semiconductor photonics device 400 and an electrically conductive line 203 which connects the electronic control circuitry 201 with the photonics circuitry 301.

In the above examples, the SiP layer 300 may comprise a photonics layer and an electrically insulating oxide layer. The photonics layer includes the photonics circuitry, while the electrically insulating oxide layer is positioned under the photonics layer and above the CMOS layer. A plurality of electrically conductive lines may be embedded in the electrically insulating oxide layer and may connect the electronic control circuitry of the CMOS layer to at least one of the photonics circuitry 301 and the DBG semiconductor photonics device 400.

In examples of the present disclosure, the optical coupling 302 may be by virtue of an optical structure which couples light in one direction, or both directions, between the DBG semiconductor photonics device 400 and the photonics circuitry 301. The optical coupling structure may couple light vertically between the DBG semiconductor photonics device and the photonics circuitry in the SiP layer. In this context "couple light vertically" means couple the light into a layer above or into a layer below and includes coupling at various angles to the horizontal. Vertical coupling is in contrast to butt coupling which is coupling light horizontally from one component to another in the same plane. The optical coupling structure of the present disclosure may include, but is not limited to any of the following structures: an evanescent coupling structure, a grating, a mirror and an angled facet of the DBG semiconductor device. Various examples will now be described with reference to FIGS. 13-16.

Figure 13:
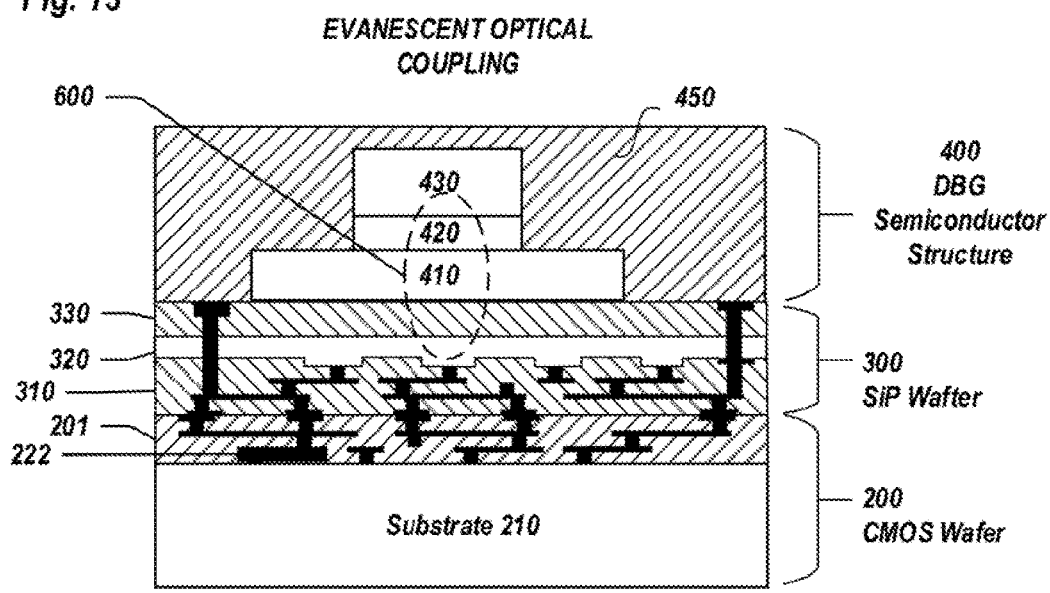
Figure 14:
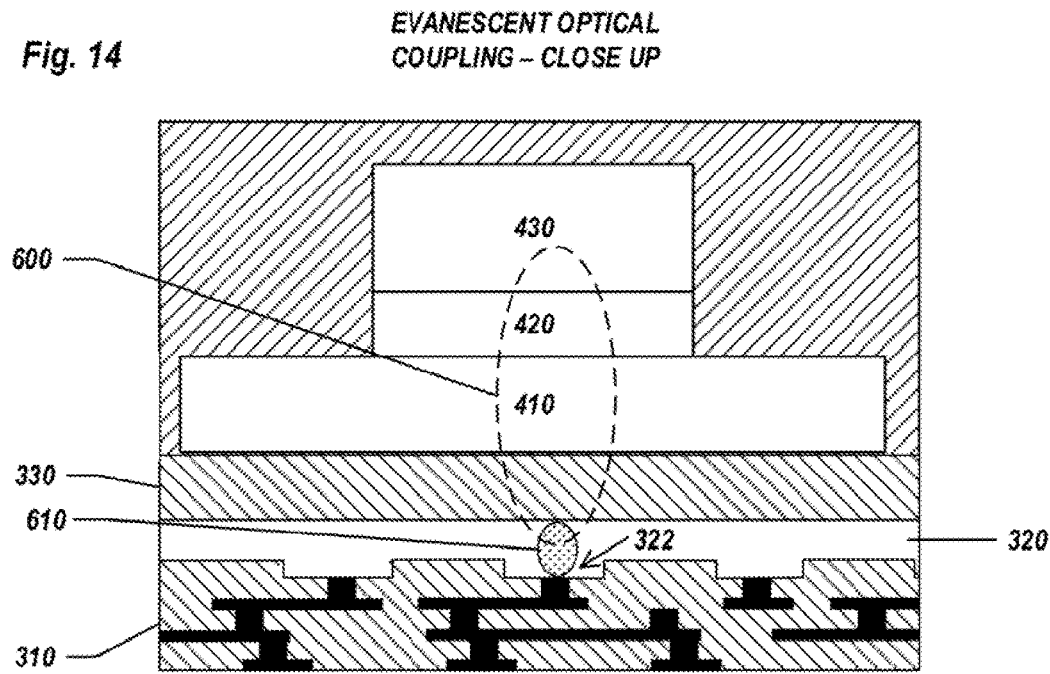

FIGS. 13 and 14 show an example of evanescent coupling. Evanescent coupling is coupling due to the evanescent field generated by a light wave. For instance, evanescent coupling may occur between two waveguides which are close together, such that the evanescent field generated by a light wave in one waveguide overlaps with the other waveguide. Thus evanescent coupling may occur between two photonic devices which are next to each other, or separated by a thin layer of material having a low refractive index.

Evanescent coupling may, for example, occur when an optical mode of the DBG semiconductor structure overlaps an optical mode of a photonic device in the photonic circuitry. An optical mode is the spatial distribution of light in a direction perpendicular to its direction of propagation in an optical medium. Light in a photonic device adopts one or more optical modes which are characteristic of the photonic device. An example of evanescent coupling will now be explained further with reference to FIGS. 13 and 14.

FIG. 13 is a cross sectional example of an assembly according to the present disclosure and is similar to FIG. 10D. Like reference numerals indicate like parts as in FIG. 10D. It is to be understood that conductive lines to connect the DBG photonics device 400 to vias 280 may be present, but are not shown in order to preserve the clarity of the diagram. The dashed line 600 indicates an optical mode of the DBG semiconductor photonics device 400. As can be seen, the optical mode 600 centers on the active region 420 of the photonics device 400. However, the optical mode overlaps with the photonic circuitry in photonics layer 320. This part of the optical mode, which overlaps the dielectric layer 330 and the photonic layer 320, is referred to as the evanescent field of the light.

FIG. 14 is a close up of the upper part of FIG. 13 and shows how the optical mode 600 overlaps with a photonic device 322 in the photonics layer 320. The photonics circuitry in layer 320 includes at least the photonic device 322 and may include other photonic devices as well. The photonic device 322 may, for example, be a waveguide. The evanescent field of the optical mode 600 overlaps with the photonic device 322 and excites an optical mode 610 in the photonic device 322. The optical mode 610 is shown in FIG. 14 by the ellipsoid 610 which is shaded with dots. This phenomena is known as evanescent coupling. In order for evanescent coupling to take place the DBG photonics device 400 and the photonic device 322 should be close enough that they have optical modes which overlap. Evanescent coupling is also affected by the refractive index and relative thickness of any material, such as dielectric layer 330, which lies between the DBG photonics device 400 and the photonic device 322. Evanescent coupling is more likely where any such intermediate layer 330 is relatively thin and has a relatively low refractive index compared to the refractive indexes of the cores of the photonic devices 400, 322. For this reason, in some examples, the dielectric layer 330 may be thinned or even removed, as mentioned in block 750 of FIG. 7, as well as shown in FIGS. 8E and 8F.

In some examples the evanescent coupling structure may be formed as a result of bonding the DBG semiconductor structure 400 to the SiP wafer 300. For example, if the DBG semiconductor structure 400 and a photonic component 322 of the photonic circuitry are close enough when the DBG then this may form an evanescent coupling structure. In other examples, the evanescent coupling structure may not exist immediately after bonding the DBG semiconductor structure 400 to the SiP wafer, but may be created by subsequent processes. For instance, in some examples, etching the DBG semiconductor structure 400 may create an optical mode which overlaps with the photonic circuitry, while in other examples an overlapping optical mode may exist even before etching.

Evanescent coupling is one type of optical path which may link the DBG semiconductor structure 400 with the photonic circuitry 301. Other types of optical coupling structure include optical paths comprising a grating, mirror or angled facet etc. Examples are shown in FIGS. 15 and 16.

FIG. 15 is a close up of the upper part of a hybrid photonic electronic integrated assembly according to the present disclosure, similar to FIG. 14. However, while FIG. 14 showed evanescent coupling, in FIG. 15 the optical coupling is by a path including an angled facet 412 positioned at one end of the DBG photonic device 400. The angled facet 412 directs light 620 from an optical mode 600 of the DBG photonic device, downward into the layers below by virtue of internal reflection. The light 620 is received by a grating 324 of the photonic circuitry in layer 320 and may be directed by the grating 324 to another photonic device 322, such as a waveguide, in layer 320.

FIG. 16 is similar to FIG. 15, except that instead of a grating 324, the light 620 is received by an angled facet 326 and directed into a waveguide 322 of the photonic layer 320. In other examples the grating or angled facets described above may be replaced by mirrors.

While the above examples have been described in relation to transferring an optical signal from the DBG semiconductor structure to the photonic circuitry in the SiP wafer, it will be understood that similar techniques could be used to transfer light from the photonic circuitry to the DBG semiconductor structure.

Figure 17:
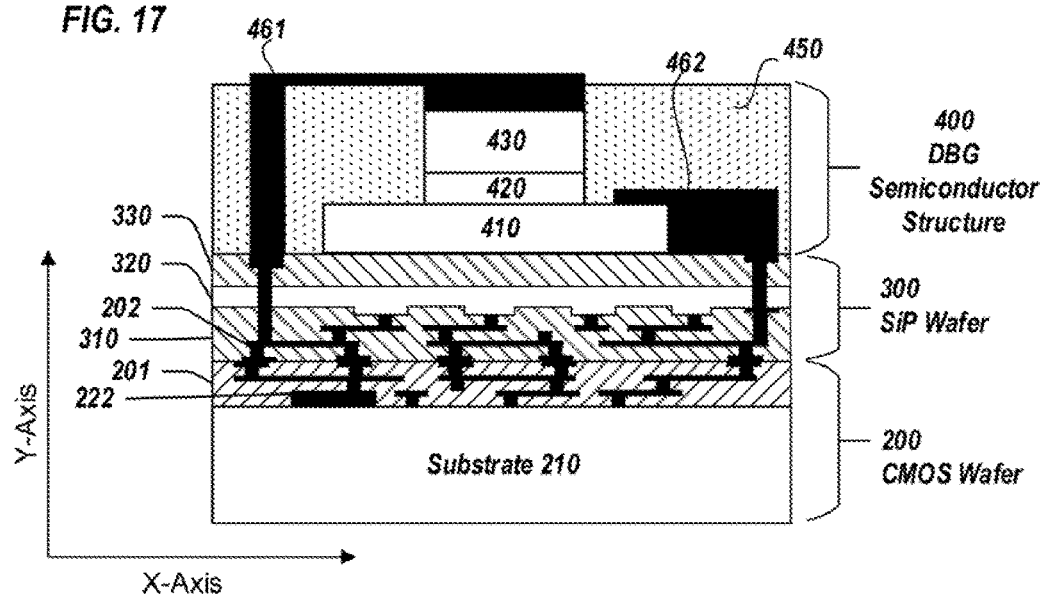
FIG. 17 is a cross sectional diagram along the x-y axis showing an example of a hybrid photonics electronics integrated chip according to the present disclosure.

Examples structures of DBG semiconductor lasers will now be described. FIG. 17 is similar to FIG. 10E and shows a cross section in the X-Y plane of an example device comprising a DBG semiconductor laser which is bonded to an assembly comprising a SiP layer 300 and CMOS layer 200, as described in the earlier examples. Like numerals denote like parts as in FIG. 10E. The laser may for example be a horizontal cavity laser or a vertical cavity surface emitting laser (VCESL).

Figure 18:
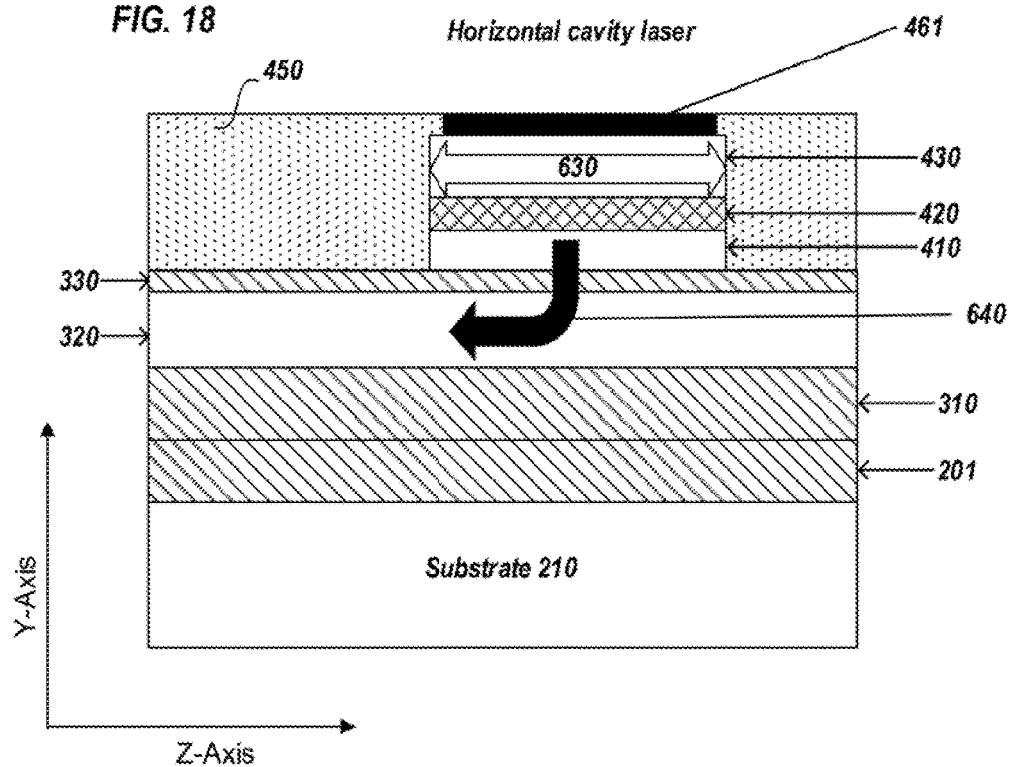
FIG. 18 is a cross sectional diagram along the y-z axis showing an example of a hybrid photonics electronics integrated chip including a DBG horizontal cavity laser according to the present disclosure.

FIG. 18 shows a cross section in the Y-Z plane of the device of FIG. 17, in the case that the laser is a horizontal cavity laser. Like reference numerals denote like parts as in FIG. 17. For clarity, the detailed structure of the electrical interconnect layer 310 and the electronic circuitry layer 201 are not shown. The arrow 630 shows the general direction of light confined horizontally in the laser cavity along the Z direction. The light may be mostly confined to the active layer 420 and reflect back and forth between the ends of the laser so that lasing occurs. A portion of the laser light is coupled to the photonic circuitry in layer 320 as shown by the arrow 640.

Figure 19:
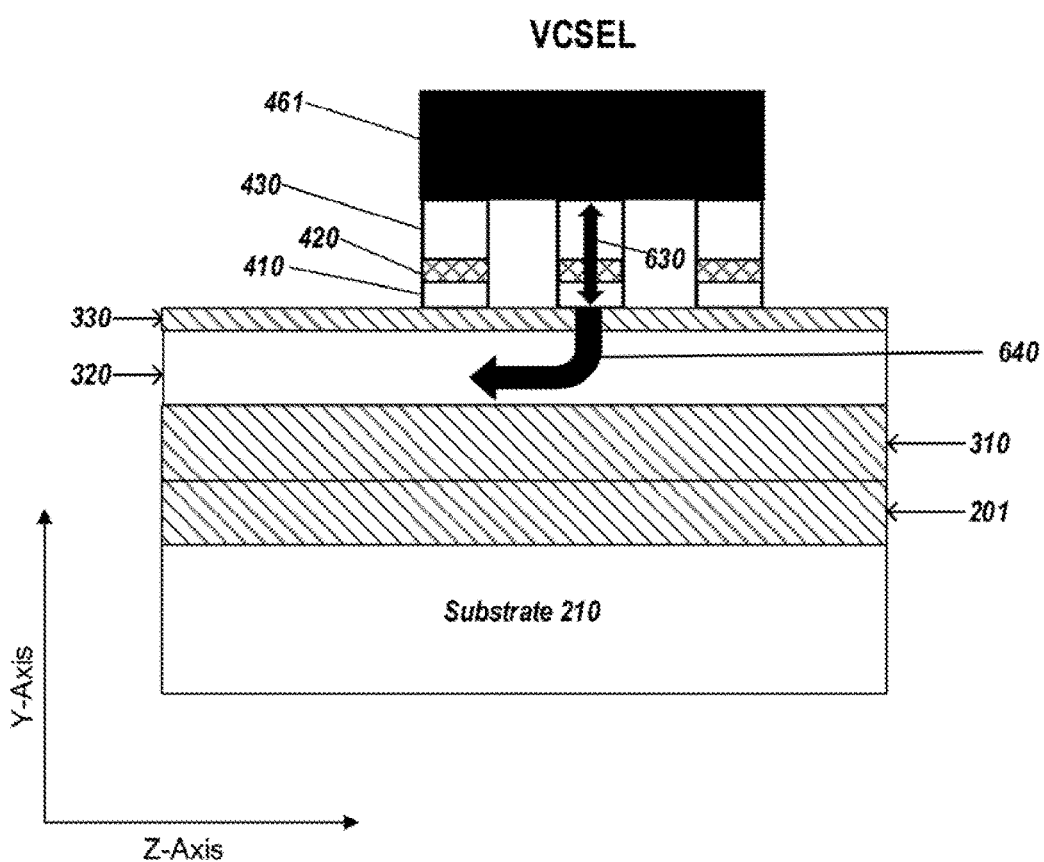
FIG. 19 is a cross sectional diagram along the y-z axis showing an example of a hybrid photonics electronics integrated chip including a DBG VCSEL according to the present disclosure.

FIG. 19 shows a cross section in the Y-Z plane of the device of FIG. 17, in the case that the laser is a VCESL. Like reference numerals denote like parts as in FIG. 17. For clarity, the detailed structure of the electrical interconnect layer 310 and the electronic circuitry layer 201 are not shown. The arrow 630 shows the general direction of light confined vertically in the laser cavity along the Y direction. The light may reflect back and forth between the ends of the laser and be amplified in the active region 420 so that lasing occurs. A portion of the laser light is coupled to the photonic circuitry in layer 320 as shown by the arrow 640.

All of the features disclosed in this specification (including any accompanying claims, abstract and drawings), and/or all of the blocks of any method or process so disclosed, may be combined in any combination, except combinations where at least some of such features and/or blocks are mutually exclusive. Furthermore, except where explicitly stated otherwise or where the context or logic demands otherwise, the processes described herein may be carried out in any order and are not limited to the specific order shown in the particular examples. Some the processes or method blocks described herein may be carried contemporaneously with each other.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example of a generic series of equivalent or similar features.

What is claimed is:

1. A method comprising:
   receiving an assembly comprising a silicon photonics (SiP) wafer bonded to a complementary metal-oxide-semiconductor (CMOS) wafer, wherein the SiP wafer includes photonics circuitry and the CMOS wafer includes electronic circuitry; and
   after receiving the assembly:
      bonding a direct bandgap (DBG) semiconductor structure to the SiP wafer such that the SiP wafer is disposed between the CMOS wafer and the DBG semiconductor structure;
      optically coupling the direct bandgap (DBG) semiconductor structure to the photonics circuitry; and
      electrically connecting the DBG semiconductor structure to the electronic circuitry of the CMOS wafer.

2. The method of claim 1 wherein the SiP wafer comprises a photonics layer including the photonics circuitry and an electrical interconnect layer including an electrically conductive line embedded in electrically insulating material; the electrically conductive line connecting the electronic circuitry of the CMOS wafer with the photonics circuitry in the photonics layer.

3. The method of claim 1 wherein electrically connecting the DBG semiconductor structure to the electronic circuitry of the CMOS wafer includes connecting an electrical contact of the DBG semiconductor structure with a via which extends at least partially through the SiP wafer.

4. The method of claim 1 wherein the DBG semiconductor structure includes an active layer and at least one cladding layer.

5. The method of claim 1 comprising processing the DBG semiconductor structure to form a laser, a photodiode, an optical modulator, an optical amplifier or another type of active photonics device.

6. The method of claim 5 wherein the processing includes etching the DBG semiconductor structure to form an optical structure to confine light in an active region of the DBG semiconductor structure.

7. The method of claim 1 wherein the DBG semiconductor structure includes a group III-V material.

8. The method of claim 1 wherein the bonding of the DBG semiconductor structure to the SiP wafer is by molecule bonding.

9. The method of claim 1 comprising forming an optical path to couple the DBG semiconductor structure to the photonics circuitry, the optical path including at least one of an evanescent coupling structure, a grating, a mirror and an angled facet.

10. The method of claim 1 comprising bonding a SiP wafer to a CMOS wafer to form the assembly.

11. The method of claim 10 comprising, after bonding the SiP wafer to the CMOS wafer, removing a silicon substrate of the SiP wafer.

12. The method of claim 10 comprising, after bonding the SiP wafer to the CMOS wafer, thinning or removing a dielectric layer of the SiP wafer.

13. The method of claim 1 wherein the SiP wafer includes a plurality of photonic integrated chips, the CMOS wafer includes a plurality of electronic integrated chips and bonding the DBG semiconductor structure to the SiP wafer includes bonding a DBG wafer comprising a plurality of DBG semiconductor structures to the SiP wafer; and wherein the method includes optically coupling each respective DBG semiconductor structure to a respective photonic integrated chip.

14. A hybrid photonics electronics integrated chip comprising:
a complementary metal-oxide-semiconductor (CMOS) layer including electronic control circuitry;
a silicon photonics (SIP) layer bonded to the CMOS layer, the SiP layer including photonics circuitry;
a direct bandgap (DBG) semiconductor layer bonded to the SiP layer such that the SiP layer is disposed between the CMOS layer and the DBG semiconductor layer, the DBG semiconductor layer including a DBG semiconductor photonics device which is optically coupled to the photonics circuitry of the SiP layer; and
an electrically conductive line connecting the electronic circuitry of the CMOS layer to the photonics circuitry or to an electrical contact of the DBG semiconductor photonics device.

15. The integrated chip of claim 14 wherein the electrically conductive line includes a via which extends at least partially through the SiP layer and connects the electronic circuitry in the CMOS layer with the electrical contact of the DBG semiconductor photonics device.

16. The integrated chip of claim 14 wherein the SiP layer includes a photonics layer that includes the photonics circuitry, an electrically insulating layer which is positioned under the photonics layer and above the CMOS layer; and a plurality of electrically conductive lines embedded in the electrically insulating layer and connecting the electronic circuitry of the CMOS layer with the photonics circuitry and with the DBG semiconductor photonics device.

17. The integrated chip of claim 14 comprising a structure to couple light vertically between the DBG semiconductor photonics device and the photonics circuitry in the SiP layer.

18. A hybrid photonics-electronics wafer assembly comprising:
a complementary metal-oxide-semiconductor (CMOS) wafer including a plurality of electronic integrated circuits;
a silicon photonics (SiP) wafer bonded to the CMOS wafer, the SiP wafer including a plurality of photonic integrated circuits;
a direct bandgap (DBG) semiconductor wafer bonded to the SiP wafer such that the SiP wafer is disposed between the CMOS wafer and the DBG semiconductor wafer, the DBG semiconductor wafer including a plurality of photonic devices;
wherein each respective photonic device of the DBG semiconductor wafer is optically coupled to a respective photonic integrated circuit of the SiP wafer.

19. The hybrid photonics-electronics wafer assembly of claim 18 wherein each photonic device of the direct bandgap semiconductor wafer is electrically coupled to a respective electronic integrated circuit of the CMOS wafer.

20. The hybrid photonics-electronics wafer assembly of claim 18 wherein each photonic integrated circuit of the SiP wafer is electrically coupled to a respective electronic integrated circuit of the CMOS wafer.

* * * * *